United States Patent
Cohen et al.

(10) Patent No.: US 7,109,118 B2
(45) Date of Patent: Sep. 19, 2006

(54) ELECTROCHEMICAL FABRICATION METHODS INCLUDING USE OF SURFACE TREATMENTS TO REDUCE OVERPLATING AND/OR PLANARIZATION DURING FORMATION OF MULTI-LAYER THREE-DIMENSIONAL STRUCTURES

(75) Inventors: Adam L. Cohen, Los Angeles, CA (US); Dennis R. Smalley, Newhall, CA (US); Michael S. Lockard, Lake Elizabeth, CA (US); Qui T. Le, Anaheim, CA (US)

(73) Assignee: Microfabrica Inc., Van Nuys, CA (US)

( * ) Notice: Subject to any disclaimer, the term of this patent is extended or adjusted under 35 U.S.C. 154(b) by 0 days.

(21) Appl. No.: 10/841,100

(22) Filed: May 7, 2004

(65) Prior Publication Data

US 2005/0032362 A1    Feb. 10, 2005

Related U.S. Application Data

(60) Provisional application No. 60/468,979, filed on May 7, 2003, provisional application No. 60/469,053, filed on May 7, 2003, provisional application No. 60/533,891, filed on Dec. 31, 2003, provisional application No. 60/468,977, filed on May 7, 2003, provisional application No. 60/534,204, filed on Dec. 31, 2003.

(51) Int. Cl.
*H01L 21/311* (2006.01)

(52) U.S. Cl. ........................ 438/697; 438/692
(58) Field of Classification Search ................ 438/697, 438/692, 680, 706, 712, 745

See application file for complete search history.

(56) References Cited

U.S. PATENT DOCUMENTS

| | | | | |
|---|---|---|---|---|
| 5,190,637 A | * | 3/1993 | Guckel | 205/118 |
| 5,230,965 A | | 7/1993 | Cole, Jr. et al. | 428/601 |
| 6,027,630 A | * | 2/2000 | Cohen | 205/135 |
| 6,458,263 B1 | | 10/2002 | Morales et al. | 205/118 |
| 6,790,377 B1 | | 9/2004 | Cohen | 216/94 |
| 2003/0022168 A1 | | 1/2003 | Kasabara et al. | 435/6 |
| 2003/0127336 A1 | | 7/2003 | Cohen et al. | 205/93 |
| 2003/0234179 A1 | | 12/2003 | Bang | 205/70 |

(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, p. 161.

(Continued)

*Primary Examiner*—David Nhu
(74) *Attorney, Agent, or Firm*—Dennis R. Smalley

(57) ABSTRACT

A method of fabricating three-dimensional structures from a plurality of adhered layers of at least a first and a second material wherein the first material is a conductive material and wherein each of a plurality of layers includes treating a surface of a first material prior to deposition of the second material. The treatment of the surface of the first material either (1) decreases the susceptibility of deposition of the second material onto the surface of the first material or (2) eases or quickens the removal of any second material deposited on the treated surface of the first material. In some embodiments the treatment of the first surface includes forming a dielectric coating over the surface and the second material is electrodeposited (e.g. using an electroplating or electrophoretic process). In other embodiments the first material is coated with a conductive material that doesn't readily accept deposits of electroplated or electroless deposited materials.

69 Claims, 20 Drawing Sheets

U.S. PATENT DOCUMENTS

| | | | |
|---|---|---|---|
| 2004/0000489 A1 | 1/2004 | Zhang et al. | 205/118 |
| 2004/0004001 A1 | 1/2004 | Cohen et al. | 205/118 |
| 2004/0007470 A1 | 1/2004 | Smalley | 205/118 |
| 2004/0020782 A1 | 2/2004 | Cohen et al. | 205/223 |
| 2004/0065550 A1 | 4/2004 | Zhang | 205/118 |
| 2004/0065555 A1 | 4/2004 | Zhang | 205/123 |
| 2004/0134772 A1 | 7/2004 | Cohen et al. | 204/198 |
| 2004/0134788 A1 | 7/2004 | Cohen et al. | 205/135 |
| 2004/0140862 A1 | 7/2004 | Brown et al. | 333/117 |
| 2004/0146650 A1 | 7/2004 | Lockard et al. | 427/307 |
| 2004/0147124 A1 | 7/2004 | Cohen et al. | 438/689 |
| 2004/0182716 A1 | 9/2004 | Cohen et al. | 205/170 |
| 2004/0251142 A1 | 12/2004 | Cohen et al. | 205/223 |
| 2005/0032375 A1 | 2/2005 | Lockard et al. | 438/689 |
| 2005/0067292 A1 | 3/2005 | Thompson et al. | 205/118 |
| 2005/0072681 A1 | 4/2005 | Cohen et al. | 205/170 |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 1999, p. 244.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Adam L. Cohen, "Electrochemical Fabrication (EFABTM)", Chapter 19 of the MEMS Handbook, edited by Mohamed Gad-El-Hak, CRC Press, 2002, pp. 19/1—19/23.

"Microfabrication — Rapid Prototyping's Killer Application", Rapid Prototyping Report, CAD/CAM Publishing, Inc., Jun. 1999, pp. 1-5.

* cited by examiner

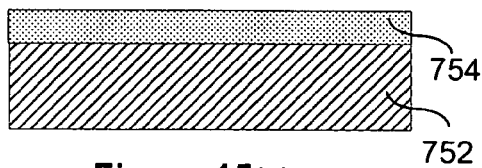
Figure 15(a)
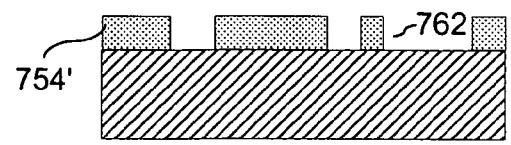
Figure 15(b)
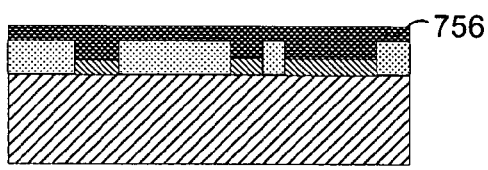
Figure 15(d)
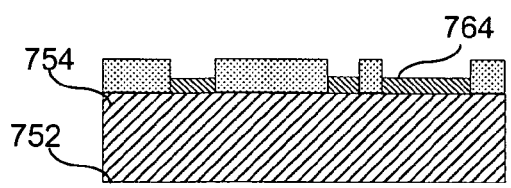
Figure 15(c)
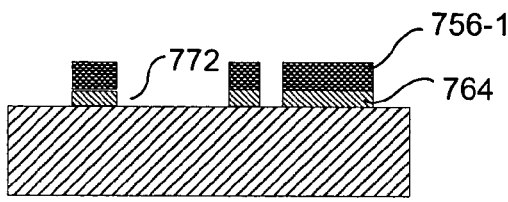
Figure 15(e)-1
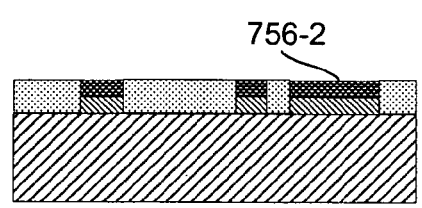
Figure 15(e)-2'
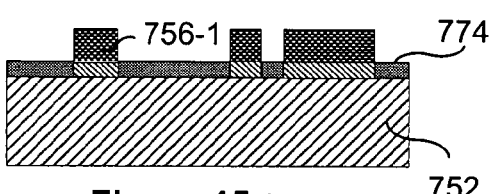
Figure 15(f)-1
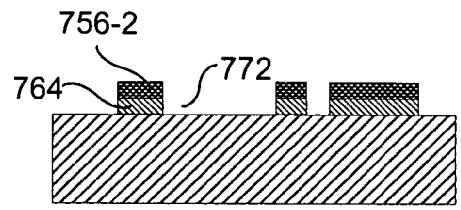
Figure 15(e)-2"
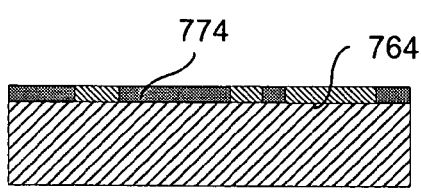
Figure 15(g)
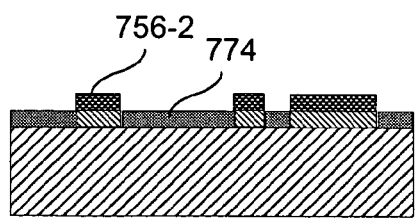
Figure 15(f)-2

ELECTROCHEMICAL FABRICATION METHODS INCLUDING USE OF SURFACE TREATMENTS TO REDUCE OVERPLATING AND/OR PLANARIZATION DURING FORMATION OF MULTI-LAYER THREE-DIMENSIONAL STRUCTURES

RELATED APPLICATIONS

This application claims benefit of the following U.S. Provisional Patent Applications 60/468,979, filed May 7, 2003; 60/469,053, filed May 7, 2003; 60/533,891, filed Dec. 31, 2003; 60/468,977, filed May 7, 2003; and 60/534,204, filed Dec. 31, 2003. Each of these applications is hereby incorporated herein by references as if set forth in full herein.

FIELD OF THE INVENTION

Embodiments of various aspects of the invention relate to fabrication methods for forming three-dimensional structures (e.g. meso-scale or micro-scale structures) from layers that include at least two deposited materials wherein the methods include treating or deactivating a surface of a first deposited material such that deposition of a second material onto the surface of the first material is reduced or eliminated and wherein the surface may be activated, modified, or further treated to make it susceptible to receiving a subsequent deposition.

BACKGROUND

A technique for forming three-dimensional structures (e.g. parts, components, devices, and the like) from a plurality of adhered layers was invented by Adam L. Cohen and is known as Electrochemical Fabrication. It is being commercially pursued by Microfabrica™ Inc. (formerly MEMGen® Corporation) of Burbank, Calif. under the name EFAB®. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica™ Inc. (formerly MEMGen® Corporation) of Burbank, Calif. such masks have come to be known as INSTANT MASKS™ and the process known as INSTANT MASKING or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p161, August 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFABTM)", Chapter 19 of The MEMS Handbook, edited by Mohamed Gad-EI-Hak, CRC Press, 2002.

(9) "Microfabrication—Rapid Prototyping's Killer Application", pages 1–5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.

2. Then, blanket depositing at least one additional material by electrodeposition so that the additional deposit covers both the regions that were previously selectively deposited onto, and the regions of the substrate that did not receive any previously applied selective depositions.

3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1(a)–1(c). FIG. 1(a) shows a side view of a CC mask 8 consisting of a conformable or deformable (e.g. elastomeric) insulator 10 patterned on an anode 12. The anode has two functions. FIG. 1(a) also depicts a substrate 6 separated from mask 8. One is as a supporting material for the patterned insulator 10 to maintain its integrity and alignment since the pattern may be topologically complex (e.g., involving isolated "islands" of insulator material). The other function is as an anode for the electroplating operation. CC mask plating selectively deposits material 22 onto a substrate 6 by simply pressing the insulator against the substrate then electrodepositing material through apertures 26a and 26b in the insulator as shown in FIG. 1(b). After deposition, the CC mask is separated, preferably non-destructively, from the substrate 6 as shown in FIG. 1(c). The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1(d)–1(f). FIG. 1(d) shows an anode 12' separated from a mask 8' that includes a patterned conformable material 10' and a support structure 20. FIG. 1(d) also depicts substrate 6 separated from the mask 8'. FIG. 1(e) illustrates the mask 8' being brought into contact with the substrate 6. FIG. 1(f) illustrates the deposit 22' that results from conducting a current from the anode 12' to the substrate 6. FIG. 1(g) illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2(a)–2(f). These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2(a), illustrates that the passing of current causes material 2 within the plating solution and material 2 from the anode 12 to be selectively transferred to and plated on the cathode 6. After electroplating the first deposition material 2 onto the substrate 6 using CC mask 8, the CC mask 8 is removed as shown in FIG. 2(b). FIG. 2(c) depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/ substrate 6. The entire two-material layer is then planarized to achieve precise thickness and flatness as shown in FIG. 2(*d*). After repetition of this process for all layers, the multi-layer structure 20 formed of the second material 4 (i.e. structural material) is embedded in first material 2 (i.e. sacrificial material) as shown in FIG. 2(*e*). The embedded structure is etched to yield the desired device, i.e. structure 20, as shown in FIG. 2(*f*).

Various components of an exemplary manual electrochemical fabrication system 32 are shown in FIGS. 3(*a*)–3 (*c*). The system 32 consists of several subsystems 34, 36, 38, and 40. The substrate holding subsystem 34 is depicted in the upper portions of each of FIGS. 3(*a*) to 3(*c*) and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3(*a*) includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source for driving the CC masking process.

The blanket deposition subsystem 38 is shown in the lower portion of FIG. 3(*b*) and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply for driving the blanket deposition process.

The planarization subsystem 40 is shown in the lower portion of FIG. 3(*c*) and includes a lapping plate 52 and associated motion and control systems (not shown) for planarizing the depositions.

In addition to teaching the use of CC masks for electrodeposition purposes, the '630 patent also teaches that the CC masks may be placed against a substrate with the polarity of the voltage reversed and material may thereby be selectively removed from the substrate. It indicates that such removal processes can be used to selectively etch, engrave, and polish a substrate, e.g., a plaque.

The '630 patent further indicates that the electroplating methods and articles disclosed therein allow fabrication of devices from thin layers of materials such as, e.g., metals, polymers, ceramics, and semiconductor materials. It further indicates that although the electroplating embodiments described therein have been described with respect to the use of two metals, a variety of materials, e.g., polymers, ceramics and semiconductor materials, and any number of metals can be deposited either by the electroplating methods therein, or in separate processes that occur throughout the electroplating method. It indicates that a thin plating base can be deposited, e.g., by sputtering, over a deposit that is insufficiently conductive (e.g., an insulating layer) so as to enable subsequent electroplating. It also indicates that multiple support materials (i.e. sacrificial materials) can be included in the electroplated element allowing selective removal of the support materials.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

Even though electrochemical fabrication methods as taught and practiced to date, have been proposed for the production of structures (i.e. devices, parts, components, etc.) in a variety of fields and applications and by a variety of methods, a need exist in the field for methods that can produce structures with desired configurations with reduced fabrication time, reduced fabrication cost, and/or improved process reliability.

SUMMARY OF THE DISCLOSURE

It is an object of some embodiments of various aspects of the invention to provide reduced layer formation time when forming a structure from a plurality of adhered layers.

It is an object of some embodiments of various aspects of the invention to overall fabrication time while working with layers of a fixed thickness.

It is an object of some embodiments of various aspects of the invention to reduce the amount of one or more structural or sacrificial materials used during formation of a structure or device.

It is an object of some embodiments of various aspects of the invention to reduce the amount of a second material that is deposited on a first material during formation of a layer of a structure or device.

It is an object of some embodiments of various aspects of the invention to improve process reliability by minimizing wear of tools used in planarizing layers of material.

Other objects and advantages of various aspects of the invention will be apparent to those of skill in the art upon review of the teachings herein. The various aspects of the invention, set forth explicitly herein or otherwise ascertained from the teachings herein, may address any one of the above objects alone or in combination, or alternatively it may not address any of the objects set forth above but instead address some other object of the invention which may be ascertained from the teachings herein. It is not intended that all of these objects be addressed by any single aspect of the invention even though that may be the case with regard to some aspects.

In a first aspect of the invention a method for forming at least a portion of a three-dimensional structure from a plurality of stacked and adhered layers, includes: (A)depositing and patterning a first conductive material on a substrate or previous layer to obtain a desired pattern having at least one protrusion of the first conductive material having a surface and at least one opening extending from the surface through a thickness of the first conductive material to the substrate or previously formed layer; (B) treating the surface of the first conductive material to decrease susceptibility of the surface to receive a second conductive material which is to be deposited; (C) depositing the second conductive material, such that deposition occurs with a higher selectivity to one or more regions defined by the at least one opening, wherein the selectivity results, at least in part, from the treating of the surface of the first conductive material; (D) removing the effect of the treating of the surface of the first conductive material;(E) repeating elements (a)–(d) such that a plurality of stacked layers are adhered to successively formed layers to form the at least portion of the three-dimensional structure.

In a second aspect of the invention a method for forming at least a portion of a three-dimensional structure from a plurality of stacked and adhered layers, includes: (A) depositing and patterning a first conductive material on a substrate or previous layer to obtain a desired pattern having at least one protrusion of the first conductive material having a surface and at least one opening extending from the surface through a thickness of the first conductive material to the substrate or previously formed layer; (B) treating the surface of the first conductive material to form a coating on the first conductive material which may be removed from the first material along with any second conductive material which may be deposited onto the coating; (C) depositing the second conductive material at least into the at least one opening; (D) removing the coating from the surface of the first conductive material along with any second conductive material deposited thereon; (E) repeating elements (a)–(d) such that a plurality of stacked layers are adhered to successively formed layers to form the at least portion of the three-dimensional structure.

In a third aspect of the invention a method for forming at least a portion of a three-dimensional structure from a plurality of stacked and adhered layers, includes: (A) depositing and patterning a first conductive material on a substrate or previous layer to obtain a desired pattern having at least one protrusion of the first conductive material having a surface and at least one opening extending from the surface through a thickness of the first conductive material to the substrate or previously formed layer; (B) forming a dielectric coating on the surface of the first conductive material to decrease susceptibility of the surface to receive a second conductive material which is to be deposited; (C) depositing the second conductive material, such that deposition occurs with a higher selectivity to one or more regions defined by the at least one opening, wherein the selectivity results, at least in part, from the treating of the surface of the first conductive material; (D) removing the effect of the treating of the surface of the first conductive material; (E) repeating elements (a)–(d) such that a plurality of stacked layers are adhered to successively formed layers to form the at least portion of the three-dimensional structure.

In a fourth aspect of the invention a method for forming at least a portion of a three-dimensional structure from a plurality of stacked and adhered layers, includes: (A) depositing and patterning a first conductive material on a substrate or previous layer to obtain a desired pattern having at least one protrusion of the first conductive material having a surface and at least one opening extending from the surface through a thickness of the first conductive material to the substrate or previously formed layer; (B) treating the surface of the first conductive material to decrease susceptibility of the surface to receive a second material which is to be deposited; (C) depositing the second material, such that deposition occurs with a higher selectivity to one or more regions defined by the at least one opening, wherein the selectivity results, at least in part, from the treating of the surface of the first conductive material; (D) removing the effect of the treating of the surface of the first conductive material; (E) repeating elements (a)–(d) such that a plurality of stacked layers are adhered to successively formed layers to form the at least portion of the three-dimensional structure.

A fifth aspect of the invention a method for forming at least a portion of a three-dimensional structure from a plurality of stacked and adhered layers, includes: (A) depositing and patterning a first conductive material on a substrate or previous layer to obtain a desired pattern having at least.one protrusion of the first conductive material having a surface and at least one opening extending from the surface through a thickness of the first conductive material to the substrate or previously formed layer; (B) treating the surface of the first conductive material to form a coating on the first conductive material which may be removed from the first material along with any second material which may be deposited onto the coating; (C) depositing the second material at least into the at least one opening; (D) removing the coating from the surface of the first conductive material along with any second material deposited thereon; (E) repeating elements (a)–(d) such that a plurality of stacked layers are adhered to successively formed layers to form the at least portion of the three-dimensional structure.

Further aspects of the invention will be understood by those of skill in the art upon reviewing the teachings herein. Other aspects of the invention may involve combinations of the above noted aspects of the invention and/or addition of various features of one or more embodiments to these aspects. Other aspects of the invention may involve apparatus configured to implement one or more of the above method aspects of the invention. These other aspects of the invention may provide various combinations of the aspects presented above as well as provide other configurations, structures, functional relationships, and processes that have not been specifically set forth above.

BRIEF DESCRIPTION OF THE DRAWINGS

FIGS. 15(a)–15(g) provide schematic illustrations of side views of various stages involved in the formation of a layer of a three-dimensional structure according to the flowchart of FIG. 14.

DETAILED DESCRIPTION

FIGS. 1(a)–1(g), 2(a)–2(f), and 3(a)–3(c) illustrate various features of one form of electrochemical fabrication that are known. Other electrochemical fabrication techniques are set forth in the '630 patent referenced above, in the various previously incorporated publications, in various other patents and patent applications incorporated herein by reference, still others may be derived from combinations of various approaches described in these publications, patents, and applications, or are otherwise known or ascertainable by those of skill in the art from the teachings set forth herein. All of these techniques may be combined with those of the various embodiments of the invention explicitly set forth herein to yield enhanced embodiments. Still other embodiments may be derived from combinations of the various embodiments explicitly set forth herein.

Figure 1A:
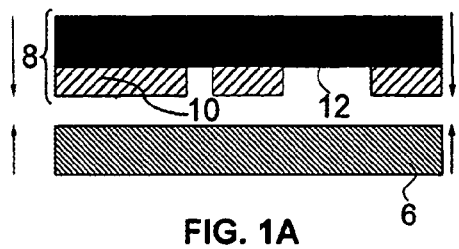
FIGS. 1(a)–1(c) schematically depict side views of various stages of a CC mask plating process, while FIGS. 1(d)–(g) schematically depict a side views of various stages of a CC mask plating process using a different type of CC mask.
Figure 1B:
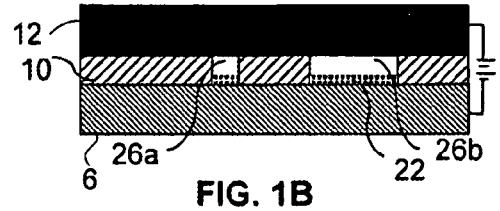
Figure 1C:
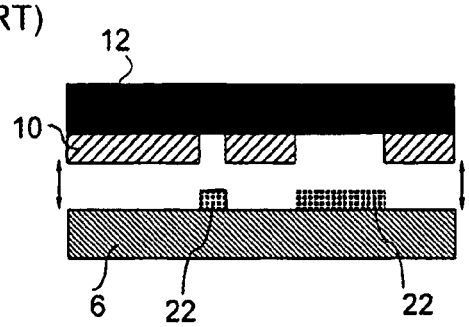
Figure 1D:
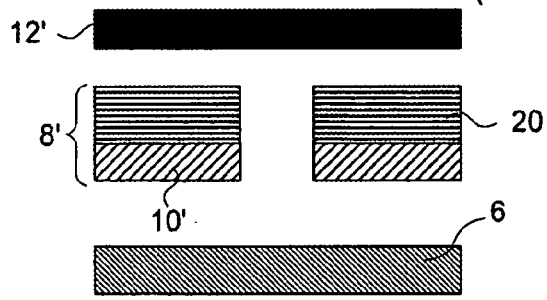
Figure 1E:
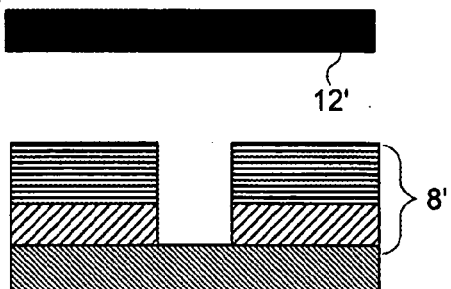
Figure 1F:
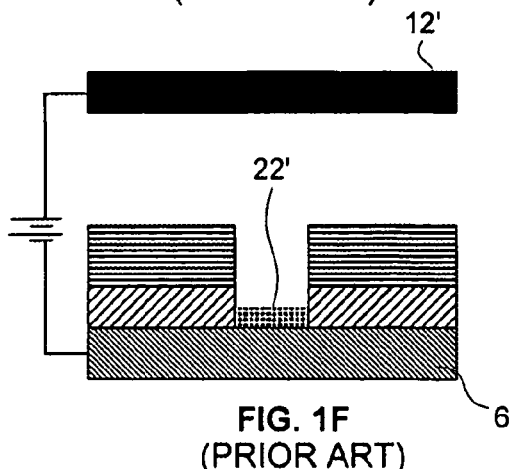
Figure 1G:
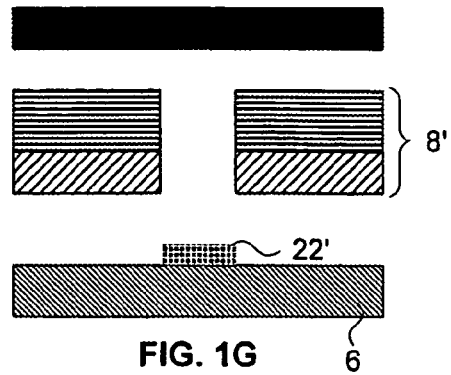
Figure 2A:
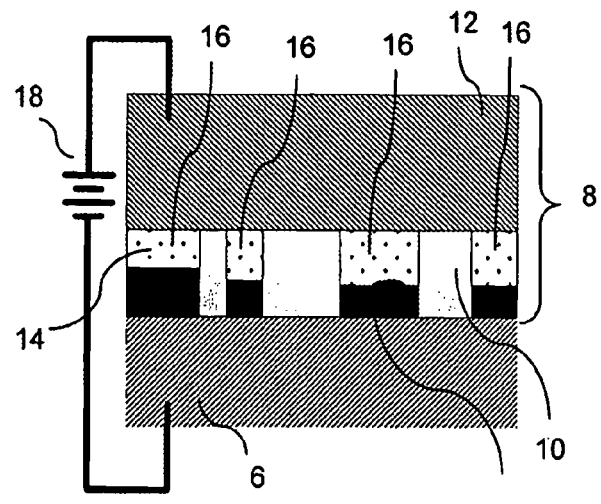
FIGS. 2(a)–2(f) schematically depict side views of various stages of an electrochemical fabrication process as applied to the formation of a particular structure where a sacrificial material is selectively deposited while a structural material is blanket deposited.
Figure 2B:
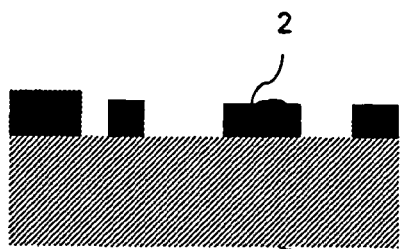
Figure 2C:
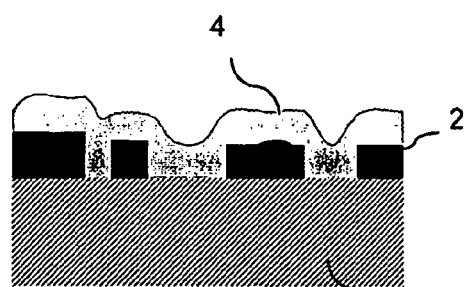
Figure 2D:
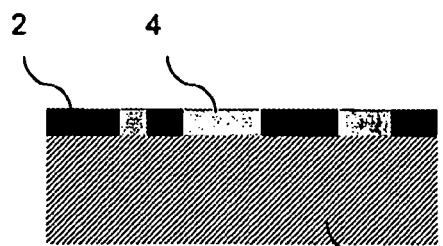
Figure 2E:
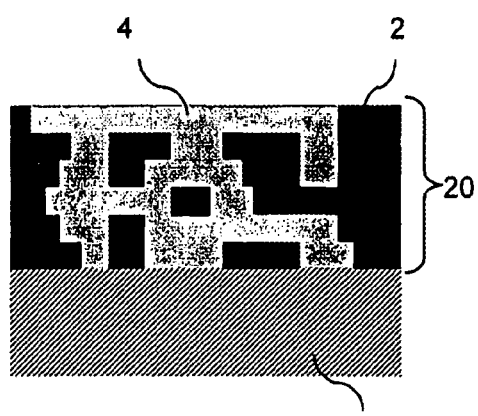
Figure 2F:
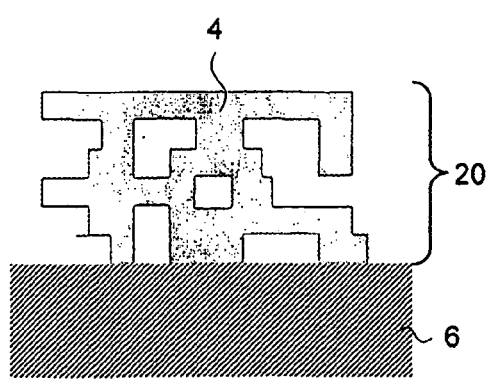
Figure 3A:
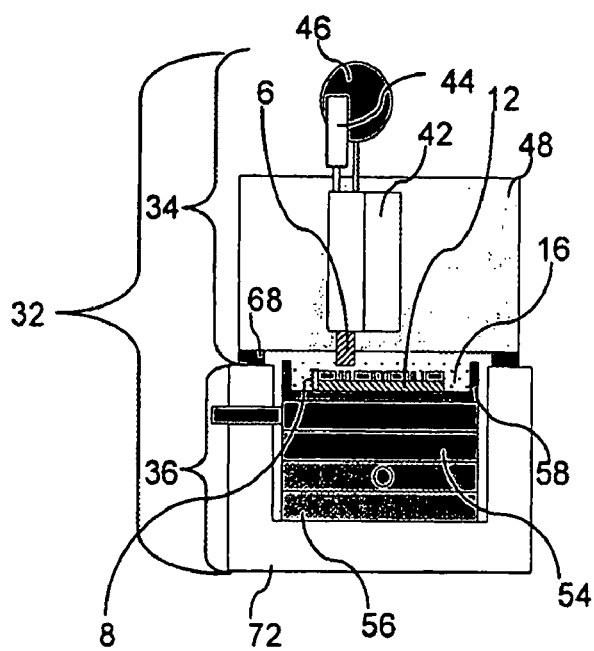
FIGS. 3(a)–3(c) schematically depict side views of various example subassemblies that may be used in manually implementing the electrochemical fabrication method depicted in FIGS. 2(a)–2(f).
Figure 3B:
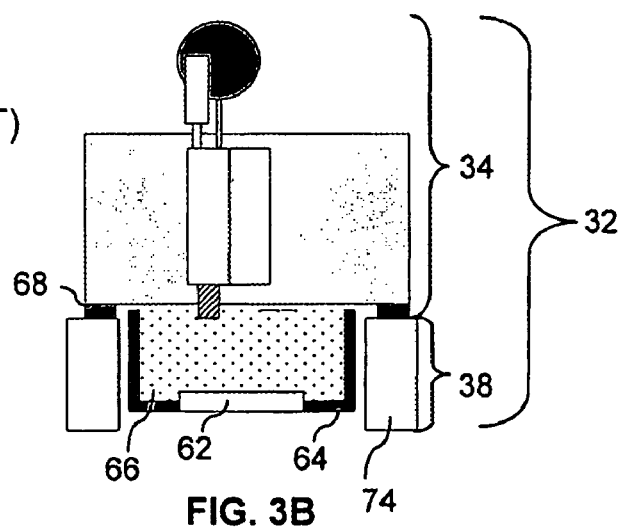
Figure 3C:
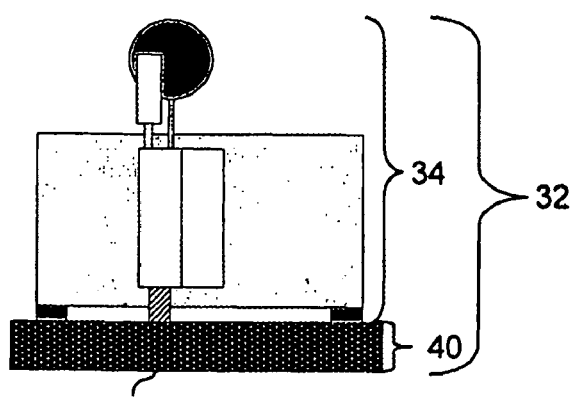
Figure 4A:
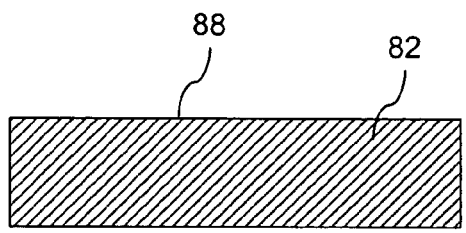
FIGS. 4(a)–4(i) schematically depict the formation of a first layer of a structure using adhered mask plating where the blanket deposition of a second material overlays both the openings between deposition locations of a first material and the first material itself.
Figure 4B:
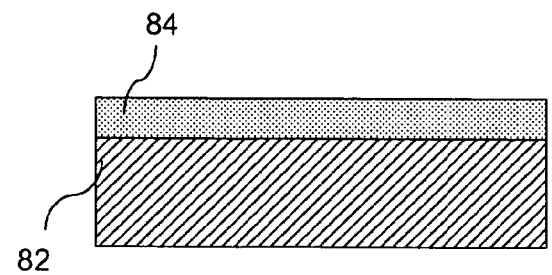
Figure 4C:
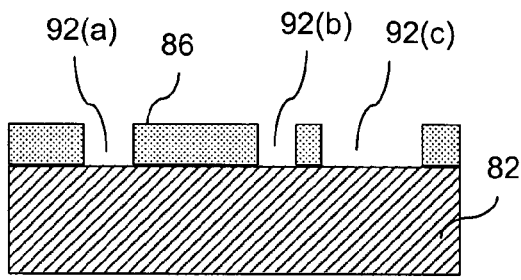
Figure 4D:
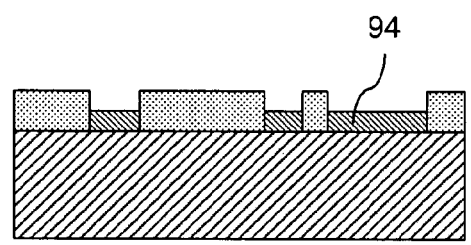
Figure 4E:
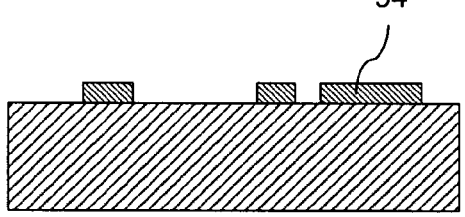
Figure 4F:
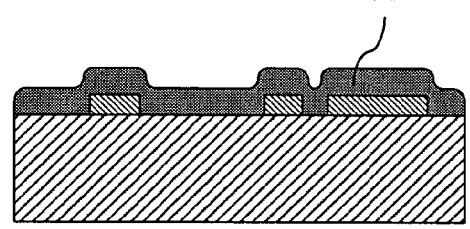
Figure 4G:
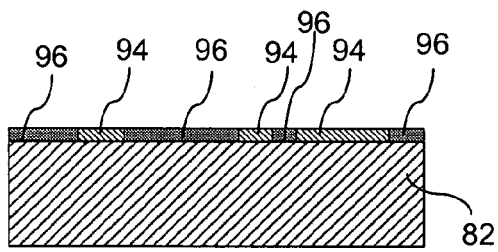
Figure 4H:
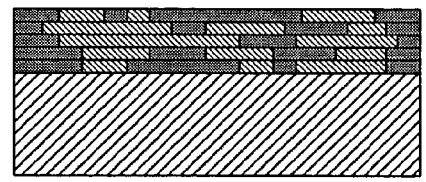
Figure 4I:
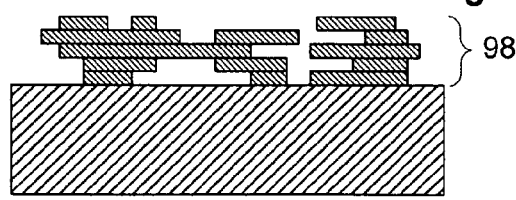

FIGS. 4(a)–4(i) illustrate various stages in the formation of a single layer of a multi-layer fabrication process where a second metal is deposited on a first metal as well as in openings in the first metal where its deposition forms part of the layer. In FIG. 4(a), a side view of a substrate 82 is shown, onto which patternable photoresist 84 is cast as shown in FIG. 4(b). In FIG. 4(c), a pattern of resist is shown that results from the curing, exposing, and developing of the resist. The patterning of the photoresist 84 results in openings or apertures 92(a)–92(c) extending from a surface 86 of the photoresist through the thickness of the photoresist to surface 88 of the substrate 82. In FIG. 4(d), a metal 94 (e.g. nickel) is shown as having been electroplated into the openings 92(a)–92(c). In FIG. 4(e), the photoresist has been removed (i.e. chemically stripped) from the substrate to expose regions of the substrate 82 which are not covered with the first metal 94. In FIG. 4(f), a second metal 96 (e.g., silver) is shown as having been blanket electroplated over the entire exposed portions of the substrate 82 (which is conductive) and over the first metal 94 (which is also conductive). FIG. 4(g) depicts the completed first layer of the structure which has resulted from the planarization of the first and second metals down to a height that exposes the first metal and sets a thickness for the first layer. In FIG. 4(h) the result of repeating the process steps shown in FIGS. 4(b)–4(g) several times to form a multi-layer structure are shown where each layer consists of two materials. For most applications, one of these materials is removed as shown in FIG. 4(i) to yield a desired 3-D structure 98 (e.g. component or device).

In some embodiments, a method is provided for limiting or preventing the electrodeposition (e.g. electroplating or electrophoretic deposition) or the electroless deposition of a second material (e.g. a conductive material or a particulate conductive or dielectric material) on top of a first conductive material, and more particularly, to a method of producing layers enhanced by such completely or partially inhibited over-deposition in a multi-layer fabrication process such as an electrochemical fabrication process (e.g. EFAB® process) where electrochemical deposition and etching techniques are used to form three-dimensional structures. Some embodiments provide a simple and economical technique for achieving a blanket deposition of a second material in such a way that the deposition becomes, in effect, a selective deposition, whereby a second material is only deposited into those regions in which a first material is not deposited. The advantages of some embodiments, may include (1) reduction in fabrication time, (2) reduction in planarization time, (3) reduction in cost of planarization, and/or (4) reduction in the cost of the second material that must be used in achieving a desired deposition.

In some embodiments, a method is provided for enhancing the ability to separate a second material deposited onto a first material by either decreasing the time to complete such separation or by simplifying the process associated with such separation.

Figure 5A:
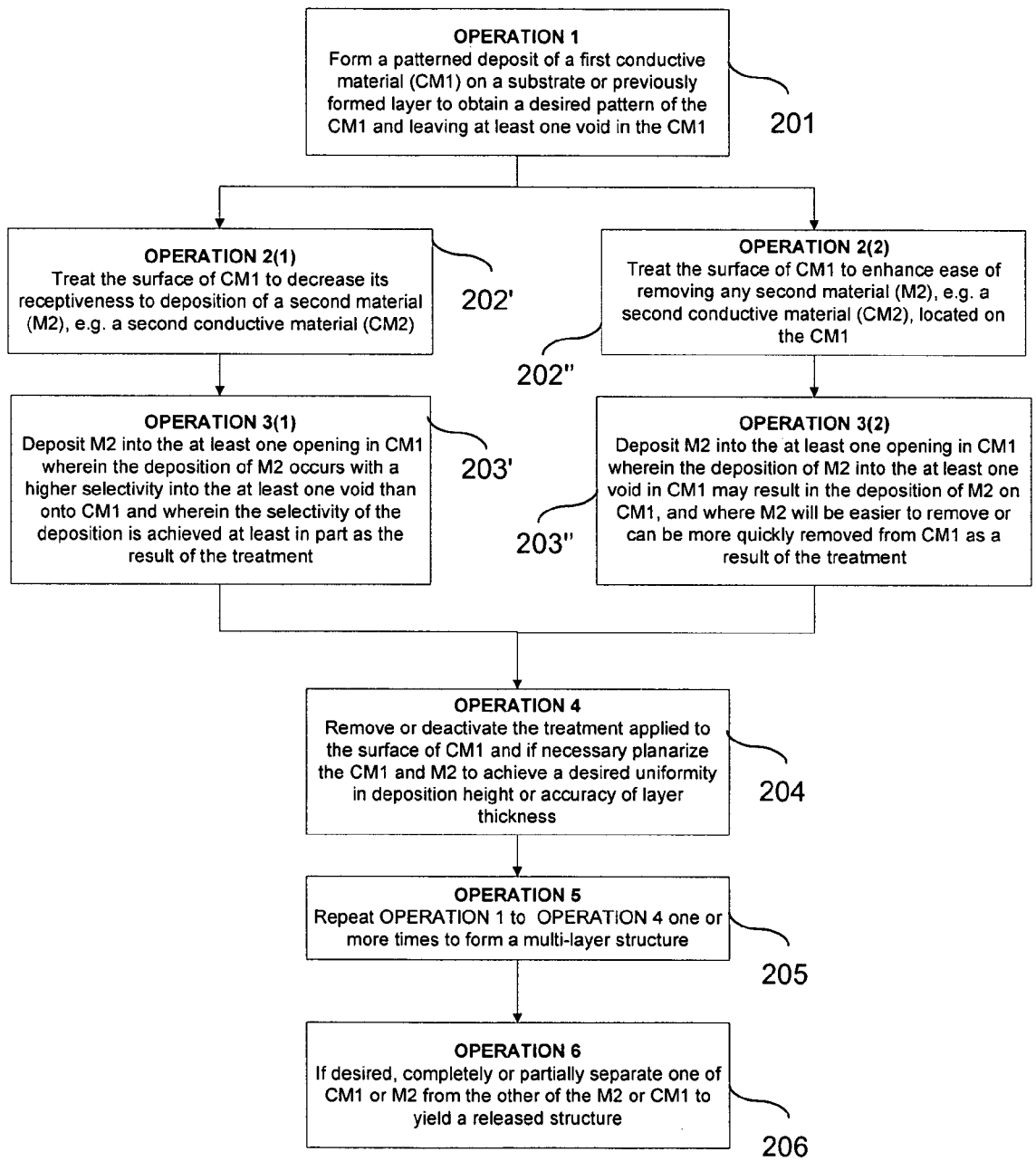
FIG. 5(a) depicts six operations associated with an embodiment of an aspect of the invention where two different flow paths may be followed when performing a second and a third operation.

FIG. 5(a) provides a flowchart depicting six operations associated with a generalized embodiment. Since some embodiments are directed to decreasing the receptiveness of a first conductive material to receiving deposits of a second material (e.g. a second conductive material) and since other embodiments are directed to enhancing the ease of, or decreasing the time of, separating a second material from the first material, the flowchart of FIG. 5(a) depicts two alternative flow paths. Both alternatives include operations 1, 4, 5 and 6. The first flow path additionally includes Operation 2(1) and Operation 3(1). The second flow path additionally includes Operation 2(2) and Operation 3(2). Of course in embodiments where the second material is a dielectric or where the substrate, or previously formed layer, is a dielectric or includes regions of dielectric, the generalized embodiment of FIG. 5 may be made to include additional operations associated with seed layer deposition and/or seed layer removal. Further details about use of seed layers and removal of seed layers may be found in various patents and patent applications incorporated herein by reference. In particular the reader's attention is specifically directed to U.S. patent application Ser. No. 10/841,300, filed concurrently herewith, by Lockard et al. and entitled "Methods for Electrochemically Fabricating Structures Using Adhered Masks, Incorporating Dielectric Sheets, and/or Seed layers That Are Partially Removed Via Planarization". For example, if needed, a first seed layer may be supplied before Operation 1 and exposed portions of it may be removed between Operation 1 and 2(1) or 2(2) and a second seed layer, if needed, may be supplied before Operation 2(1) or 2(2) or between Operations 2(1) or 2(2) and operations 3(1) or 3(2), respectively.

Operation 1, indicated by reference number 201, calls for the formation of a patterned deposit of a first conductive material (CM1) on a substrate or previously formed layer. The patterning of the first conductive material results in at least one opening, void, or aperture that extends from a distal surface of the first conductive material through its thickness to a surface of the substrate or to a surface of a previously formed layer. According to the first flow path, the process proceeds from Operation 1 to Operation 2(1), as indicated by reference number 202'.

In Operation 2(1) the distal surface of the first conductive material is treated to decrease its receptiveness to receiving a deposition of a second material (M2). In some embodiments the second material may be a conductive material while in other embodiments it may be a dielectric material such as a particulate material that may be charged and deposited using electrophoretic techniques. When the second material is a dielectric, its application will probably not require a seed layer, though its use on one layer may require the use of a seed layer on the subsequent layer prior to electrochemically depositing a conductive material.

After completion of Operation 2(1), the process proceeds to Operation 3(1), as indicated by reference number 203'. In Operation 3(1) the second material is deposited into at least one opening that extends through the first conductive material. The deposition of the second material occurs with higher selectivity toward being deposited through the opening onto the substrate, or previously formed layer, as opposed to being deposited onto the first conductive material.

After Operation 3(1) is completed, the process proceeds to Operation 4, indicated by reference number 204, where the treatment of the first conductive material as performed in Operation 2(1) is either removed or otherwise deactivated in preparation for adding additional layers of material. In addition, Operation 4 calls for the optional planarization of the first conductive material and the second material to bring them to a common height and/or to bring the overall layer height to a desired level of accuracy.

The process next proceeds to Operation 5, as indicated by reference number 205, which calls for the repetition of Operations 1 through 4, one or more times so as to build up a multi-layer structure. In embodiments where one the second material on the just formed layer is a dielectric, use of a seed layer may be required during formation of the next layer.

After completion of the formation of each layer, the process proceeds to Operation 6, as indicated by reference number 206. Operation 6 calls for the optional, partial or complete separation of one of the materials (i.e. a sacrificial material) from the other material (i.e. a structural material) so that a desired structure formed from the structural material (e.g. one of the first conductive material or the second material) is released from a sacrificial material (e.g. the other of the first conductive material or the second material) which was used as a convenience during the fabrication process. In some embodiments, both the first and second materials may be structural materials and both may remain as portions of the final structure.

In the alternative flow path of the process of FIG. 5(a), the process flows from Operation 1 to Operation 2(2), as indicated by reference number 202", where a treatment of a surface of the first conductive material is called for so as to enhance the ease of separating any second material that happens to become located on the first conductive material (e.g. located on the treatment that is located on the first conductive material). In some embodiments such treatments involve the formation of a coating on the first conductive material which coating can be lifted off the first conductive material along with any second material that happens to be located thereon.

The process then proceeds to Operation 3(2) as indicated by reference number 203', which calls for the deposition of a second material into the openings in the first conductive material where the deposition may also result in the second material becoming located on the treated first conductive material.

The process then proceeds to Operations 4, 5, and 6 as already discussed and as indicated by reference number 204.

In some alternative embodiments, one or more additional conductive materials may be added to the layer formation process. In these alternative embodiments some of the surfaces the conductive materials are treated prior to deposition of one or more subsequent materials such that the deposition(s) of one or more material favors selected locations. In some embodiments, deposition of some materials may be allowed to occur on top of other materials that form part of a layer. In some embodiments, some deposited materials need not be conductive materials. As noted above when non-conductive materials are used attention must be paid to the whether or not subsequent depositions will require the use of seed layers. Furthermore, attention may be required so that portions of such seed layers will be appropriately removed, e.g. so that conductive seed layer material is not located between overlying layers of dielectric material.

In some alternative embodiments some of operations (1)–(6) need not be completed prior to beginning what are listed as subsequent operations as some processes may be performed in parallel or as some operations share processes or portions of processes.

Figure 5B:
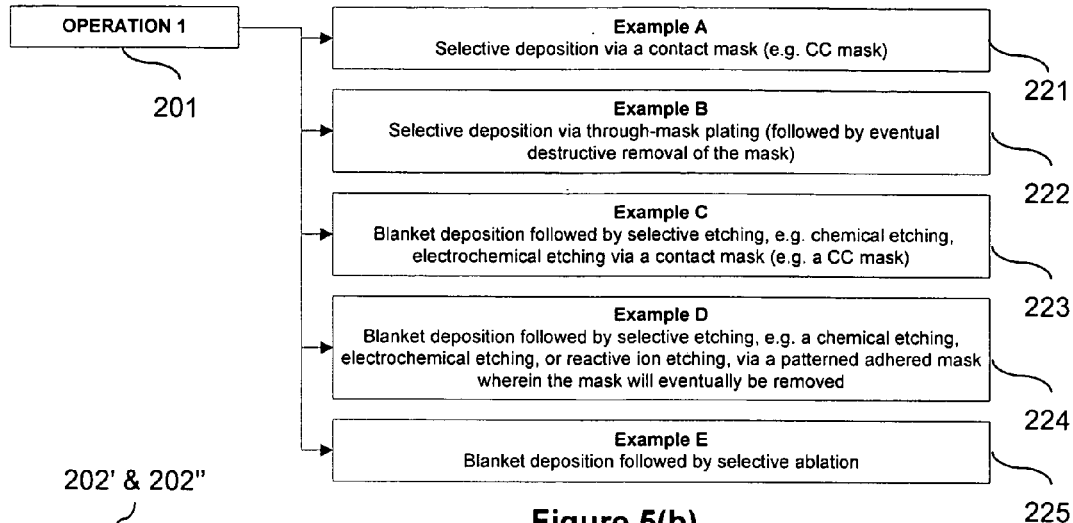
FIG. 5(b) depicts several example implementations of Operation 1 of FIG. 5(a).

FIG. 5(b) sets forth a number of example processes that may be used in performing Operation 1. A first example 221, Example A, calls for the performance of Operation 1 by selectively depositing the first conductive material using a contact mask. The contact mask may be of the conformable type as discussed herein elsewhere as well as in various patent applications and publications that have been incorporated herein by reference. The contact mask may be of the non-conformable type as described in U.S. Patent Application 60/429,484 as mentioned in the table of co-pending applications and patents set forth herein after.

A second example 222, Example B, calls for the performance of Operation 1 by selectively depositing the first conductive material using a through-mask plating operation (i.e. an adhered mask plating operations) such as that illustrated in FIG. 4(d).

A third example 223, Example C, calls for the performance of Operation 1 by performing a blanket deposition of the first conductive material followed by the selective etching of the deposited material using a contact mask (e.g. using a conformable contact mask or non-conformable contact mask). The blanket deposition may be performed by any appropriate process. For example, the blanket deposition may be performed by electroplating, electrophoretic deposition, electroless deposition, direct metallization, various types of spray metal deposition, sputtering, or the like. The etching performed through the contact mask may be performed using a variety of processes. For example the etching may be performed by chemical etching or electrochemical etching.

A fourth example 224, Example D, calls for the performance of Operation 1 by blanket deposition of the first conductive material followed by a selective etching of the deposited material via a patterned mask that is adhered to a surface of the first conductive material. The patterned mask may be formed of a variety of materials using a variety of processes. For example, the patterned mask may be formed by the selective ablation of a dielectric material that is adhered to the first conductive material. The ablation may be performed using a computer controlled laser scanning system or by exposure through a mask. In other embodiments, an etching mask may be formed using a positive or negative photoresist that is supplied in liquid form or sheet form (e.g. dry film) and adhered to the first conductive material or that is formed on the surface of the first conductive material. The photoresist may be patterned using exposure applied through a photomask and then developed to bring out the patterning. The etching operation may also be performed in a variety of ways, including, for example, chemical etching, electrochemical etching, or reactive ion etching.

A fifth example 225, Example E, calls for the performance of Operation 1 by performing a blanket deposition of the first conductive material followed by the selective removal of the deposited material by ablation.

Figure 5C:
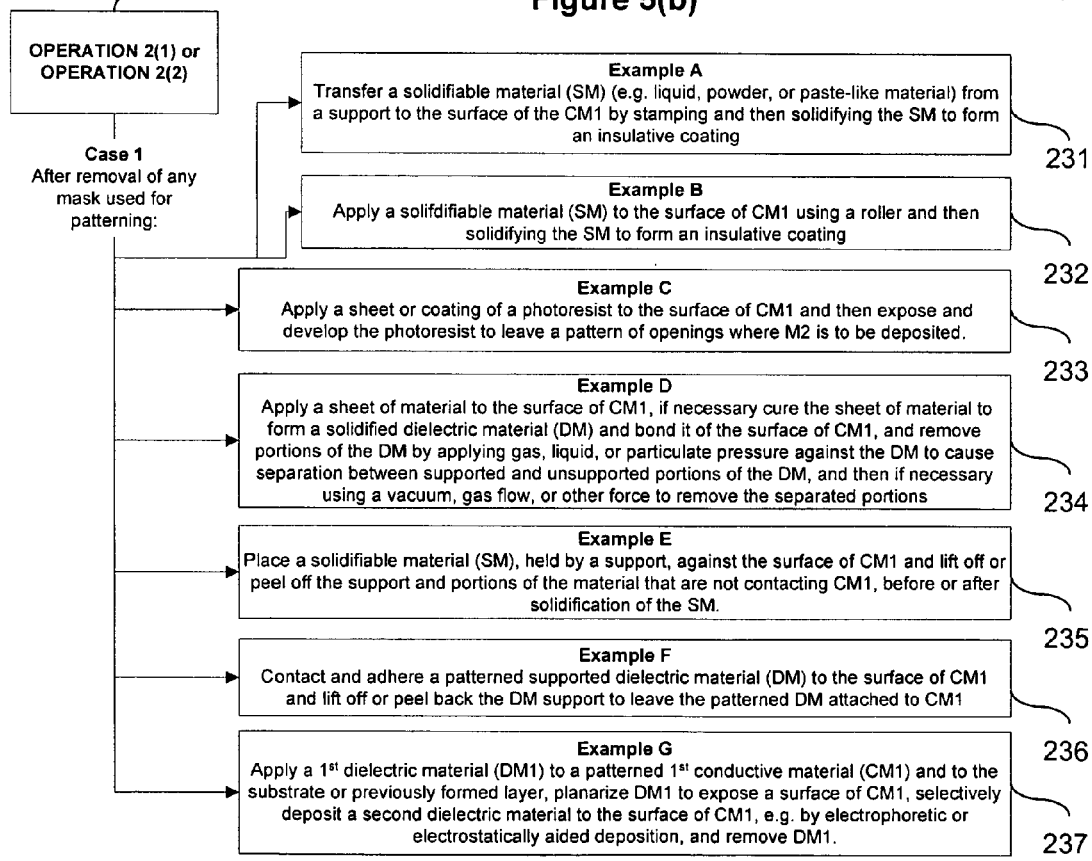
FIG. 5(c) depicts several example implementations of Operation 2 of FIG. 5(a) wherein any mask used during the deposition of Operation 1 of FIG. 5(a) is removed prior to performance of Operation 2.

FIG. 5(c), provides a number of examples of how Operations 2(1) and 2(2) may be performed. The examples of FIG. 5(c) are primarily focused on treatments that would be performed on patterned first conductive material that has been released (e.g. after removal of any mask that was used for the patterning of the first conformable material).

A first example 231, Example A, calls for performance of the treatment by stamping a solidifiable material onto the surface of the first conductive material. Stamping may be performed by use of relative motion between a support structure holding a transferable solidifiable material and the first conductive material. The stamping operation transfers sufficient solidifiable material from the support to the first conductive material after which the transferred material is solidified. The stamping process may be repeated one or more times if sufficient material is not transferred from a single stamping operation. The transfer of material only occurs where contact is made and as such controlled motion may be used to ensure that the solidifiable material only contacts the surface of the first conductive material. The transferable material may take on a variety of forms. For example it may be a liquid, powder or paste-like material. The solidification process used may be selected from any processes that are appropriate for the selected transferable material. For example, for some materials solidification may be accomplished by supplying heat, subjecting the material to pressure or to a vacuum, removing a reaction inhibitor (e.g. oxygen for some types of polymerization reactions), supplying a reaction catalyst, or exposing the material to appropriate radiation. Further teachings about transferring materials are provided in previously referenced U.S. patent application Ser. No. 10/841,300.

A second example 232, Example B, calls for the performance of the treatment by transferring a solidifiable material to the surface of the first conductive material by use of a roller. After transfer, the transferred material is solidified to form an insulative coating over the surface or surfaces of the first conductive material. In this example, as well as in the previous example, electrostatic attraction may be used to aid in the transfer process, this may be performed by placing a charge on the material to be transferred and placing an opposite charge or appropriate potential on the first conductive material or more simply be allowing the charge on the transferable material to induce a polarization in the charges in the first conductive material to cause an attractive force. In other alternative embodiments, repulsive electrostatic forces may be used in aiding the transfer of material.

A third example 233, Example C, is also provided. In this example a sheet or coating of photoresist is applied to the surface of the first conductive material. The sheet or coating is then dried or cured (if necessary), exposed, and developed so that a patterned coating over the surface of the first conductive material is obtained and such that photoresist is removed from regions that do not overlay the surface of the first conductive material.

A fourth example 234, Example D, applies and adheres a sheet of material to the surface of the first conductive material and then patterns the sheet by removing those portions of the sheet that do not overlay the surface of the first conductive material. This removal process may occur in a number of different ways. For example, the removing process may occur by applying a pressure, e.g. via gas, liquid or particles, against a surface of the sheet. This pressure may be used to sheer off those portions of the sheet that are not supported by and bound to the first conductive material. In some alternative embodiments the binding of the sheet to the surface of the first conductive material may occur after selected portions of the sheet have been removed. If the sheering process does not completely remove the separated portions of the sheet from the partially formed structure, a vacuum force or a gas or liquid stream may be used to complete the removal process.

A fifth example 235, Example E, calls for the performance of Operation 2 by contacting a solidifiable material, which is held by a support, to the surface of the first conductive material and then lifting off or peeling back the support. The lifting or peeling separates those portions of the solidifiable material that did not contact the patterned first conductive material from those portions of the solidifiable material that did contact the first conductive material. In the process of lifting off or peeling back, the non-contacted portions of the solidifiable material stay with the support while the contacted portions preferentially remain on the first conductive material. Before or after the lifting or peeling is performed, the solidifiable material may be solidified and adhered to the first conductive material.

A sixth example 236, Example F, performs Operation 2 by transferring a pre-patterned dielectric material from a support to the surface of the first conductive material. The patterned dielectric material is placed in contact with the surface of the first conductive material and the support is lifted off or peeled back leaving the patterned dielectric material on the surface of the first conductive material. The patterned dielectric may be bonded to the first conductive material before or after the lifting or peeling off. In some embodiments a partial bonding may be performed before the lift off or peeling away. Additional bonding may be performed after lifting or peeling. In some embodiments, the transferred dielectric may overhang the edges of the first conductive material slightly (so long as they do not interfere with the filling of the voids or openings adjacent to those regions occupied by the first conductive material.

A seventh example 237, Example G, performs Operation 2 by applying a first dielectric material to the substrate so that it fills the openings in the first conductive material as well as potentially overlaying the surface of the first conductive material. The first dielectric material and possibly the first conductive material are planarized to expose the first conductive material. A second dielectric material is deposited or applied selectively over the first conductive material, e.g. by electrophoretic deposition or electrostatically aided deposition, the second dielectric material is solidified and the first dielectric material removed.

Figure 5D:
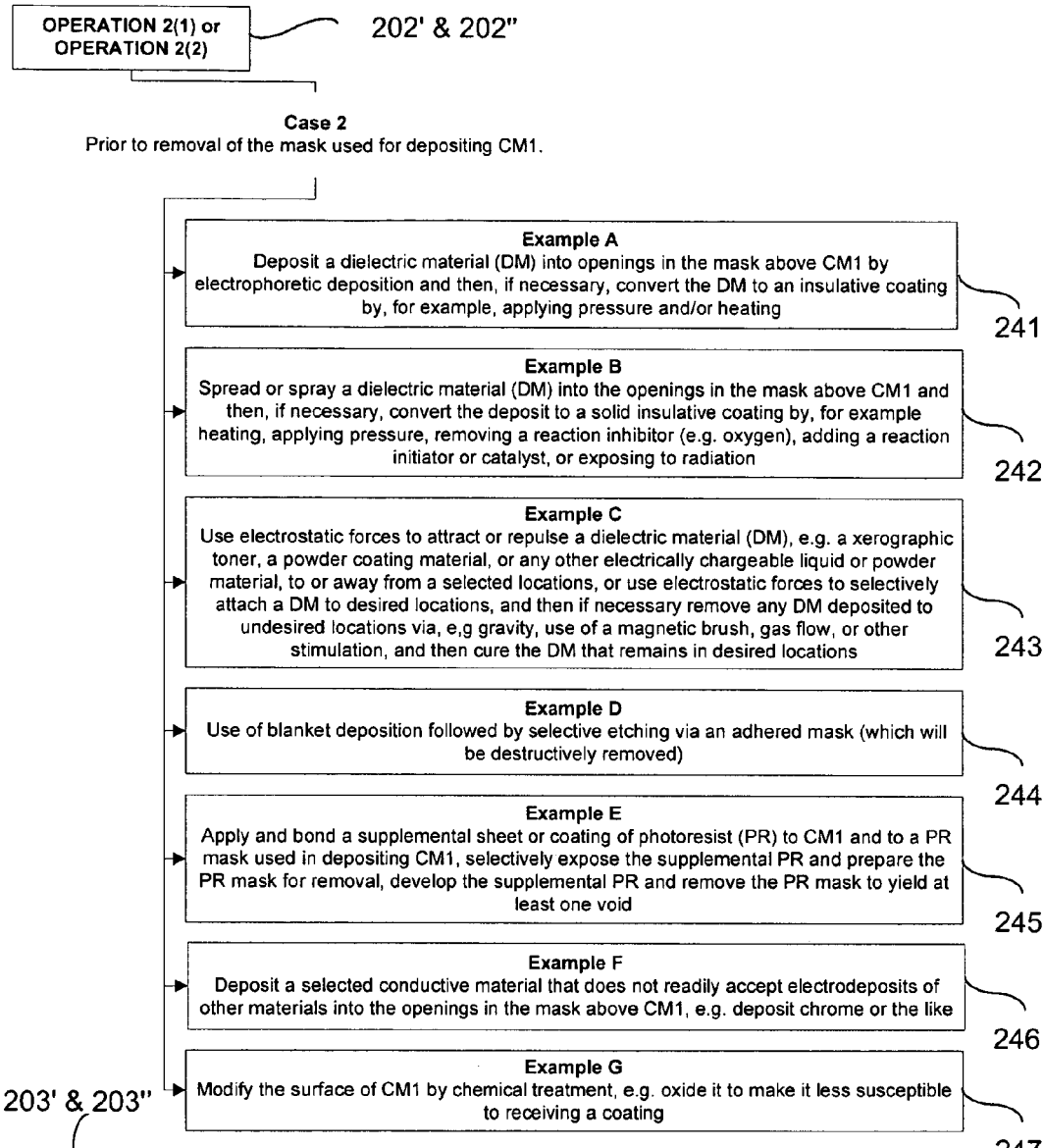
FIG. 5(d) depicts several example implementations of Operation 2 of FIG. 5(a) wherein any mask used during the deposition of Operation 1 of FIG. 5(a) remains in place during performance of Operation 2.
Figure 5E:
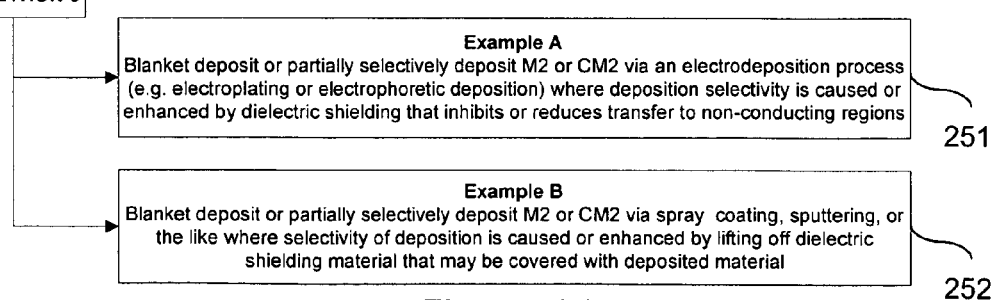
FIG. 5(e) depicts two example implementations of Operation 3 of FIG. 5(a).

FIG. 5(d) provides a number of additional examples of how the treating called for in Operation 2 might be performed. In these examples, it is assumed that the first conductive material was either deposited through a mask and that the mask remains in place or that after patterning of the first conductive material a masking material was made to surround it.

A first example 241, Example A, calls for the performance of the treatment of Operation 2 by electrophoretically depositing a dielectric material preferentially to the surface of the first conductive material. In this example, the height of the mask preferably extends beyond the height of the first conductive material such that a partial opening or openings remain in the patterned mask into which the dielectric material is deposited. In alternative embodiments, the height of the first conductive material may be substantially equal to or slightly in excess of the height of the mask.

A second example 242, Example B, calls for the performance of Operation 2 by spreading or spraying a dielectric material over the surface of the first conductive material so as to at least partially fill any openings that exist adjacent to the surface of the first conductive material as a result of a height differential between the first conductive material and the mask material. To enhance the selectivity of the net deposition of the dielectric material, a wiper blade, squeegee, air knife, or the like may be moved across the surface of the mask to at least partially remove dielectric material deposited to undesired locations (i.e. locations not in immediate proximity to the surface of the first conductive material). Prior to the performing the treatment process of this example of Operation 2, and most preferably prior to the patterning of the mask material that surrounds the first conductive material, the mask material may be planarized to provide a relatively smooth surface. The smooth surface may be beneficial in enhancing the selectivity provided by any wiping process that is intended to remove dielectric material from the surface of the mask material. The deposited dielectric material may be converted to a solid insulative material using a variety of processes. In some alternative embodiments the existence of an opening in the mask material that surrounds a deposition of the first conductive material may not be necessary so long as the removal of the masking material can be made to occur in those regions where the dielectric material overlays the masking material.

A third example 243, Example C, calls for the performance of the treatment using electrostatic effects. The electrostatic effects may be used to preferentially direct a dielectric material to the surface of the first conductive material, to preferentially repel a dielectric material from the surface of the masking material, and/or to selectively bond a dielectric material, at least temporarily, to the surface of the first conductive material. In this example various dielectric materials may be used. These materials may be in a liquid or powder form and they may include, among other things, xerographic toners or powder coating materials. Prior to dispensing or applying the dielectric material, the material is provided with a desired electric charge. One or both of the surfaces of the first conductive material and/or the mask material may also be provided with an appropriate charge or potential.

For example, the mask material may be supplied with a charge that is of the same type as that applied to the dielectric material thereby causing the dielectric material and the masking material to repel one another. The surface of the first conductive material may have a charged induced in it by the presence of the charge on the dielectric material or alternatively it may be supplied with a potential that aides in enhancing the attraction between the conductive material and the dielectric material. In some alternatives of this example, the use of electrostatic forces may not significantly aid in directing the dielectric to or away from certain locations but instead may be used to cause temporary adhesion between the dielectric and a desired location. In such cases, the dielectric material may be applied in a blanket fashion and then removed from undesired locations. The removal from undesired locations may be aided by the use of gravity, magnetic brushing, gas flow, or other stimulation. After a selectively locating the dielectric material, the dielectric material is solidified and may be more firmly adhered to the first conductive material so as to form an insulating coating over the surface of the first conductive material. The solidification or curing of the dielectric material may occur in various ways.

A fourth example, Example D, of a treatment operation is provided as indicated by reference number 244. In this example, a blanket deposition of a dielectric material is made onto the surface of the first conductive material as well as onto the surface of the substrate or previously formed layer. A mask is placed over the dielectric material and the dielectric material is selectively etched. The etching may occur in a variety of manners such as by chemical etching or electrochemical etching. In some alternative embodiments, instead of using a mask to pattern the dielectric material, ablation may be used, e.g. by an ablating laser beam that is computer controlled.

A fifth example, Example E, is provided as indicated by reference number 245. In this example a supplemental sheet or coating of photoresist is applied to the surface of the first conductive material and the mask. In this example the supplemental photoresist is exposed and developed to leave a pattern of photoresist only on the surface of the first conductive material. In this example the mask material is also removed in preparation for deposition of a second conductive material. Depending on the composition and processing of the mask material and on the composition of the supplemental photoresist, removal of the mask material may occur simultaneously with the development of the supplemental photoresist. For example, if the mask is formed from a positive photoresist and the supplemental resist is also of the positive type, exposure of the supplemental resist in regions not over laying the first conductive material may result in sufficient exposure of the mask material to allow simultaneous development and removal of the exposed portions of both the supplemental and mask materials. In another alternative, if the mask material is of a positive photoresist while the supplemental photoresist is of the negative type, the same mask (e.g. photomask) used to create the photoresist mask may be used to expose the supplemental material thereafter development of the supplemental material may be followed by blanket exposure of the mask material which is in turn followed by development of the mask material to remove it. Of course, other possibilities may be implemented as alternatives to this example.

A sixth example, Example F, is provided as indicated by reference number 246 in FIG. 5(*d*). In this example a selected conductive material is deposited into the openings in the mask above the first conductive material wherein the selected conductive material is chosen because it has a property that causes it to not readily accept electrodeposits of other materials (e.g. it may become readily passivated).

An example of such a conductive material is chrome. A deposit will either not form at all over the shielding material or if it forms, as a result of the selected material's lack of affinity for receiving the deposited material, the deposited material will not adhere well and will be readily removed during a planarization operation without the time or effort involved in removing a well adhered coating. In other embodiments, it is believed that titanium may function in a similar way.

A seventh example, Example G, is provided as indicated by reference number 247 in FIG. 5(*d*). In this example the surface of the first conductive material is modified by chemical treatment so as to make it less susceptible to receiving a coating or at minimum less susceptible to having a coating adhere tightly to it. Such treatment may involve, for example, the oxidation of the exposed surface of the first conductive material. This oxidation may occur in a variety of ways, for example, by application of selected chemicals to the surface of the first conductive material, application of an oxygen rich environment, and/or application of heat, pressure, or the like.

FIG. 5(*e*) sets forth two examples of how Operation 3 may be implemented in depositing the second material.

A first example, Example A, is provided as indicated by reference number 251. In this example the second material (e.g. a second conductive material) is blanket deposited or may be deposited using some amount of selectivity. The deposition occurs via an electrodeposition process such as, for example, electroplating or electrophoretic deposition. The net deposition however is a selective deposition as a result of the dielectric shielding provided by the treatment performed in operation 2. In alternatives of this example, other forms of deposition may be used. Such forms of deposition may include spray metal deposition using charged particles where the charged particles are attracted with the higher degree of selectivity toward the surface of the first conductive material as opposed to a surface of the dielectrically shielded material.

A second example, Example B, is indicated by reference number 252. In this example a blanket deposit of the second material occurs. The blanket deposition may be performed using a spray coating process or a sputtering process where the deposition is not achieved in a significantly selective manner that would have resulted in material only being deposited on the first conductive material. However, a net selectivity may be achieved in the end as a result of the material being deposited on the dielectric being lifted off when the dielectric shielding material is removed. In regions above the dielectric material, the deposited material may be scratched to allow access of a solvent to the dielectric material FIG. 6 depicts a flowchart setting forth operations to be followed in forming a three-dimensional structure according to an embodiment wherein a first conductive material is over coated with a dielectric material prior to depositing a second conductive material.

Figure 6:
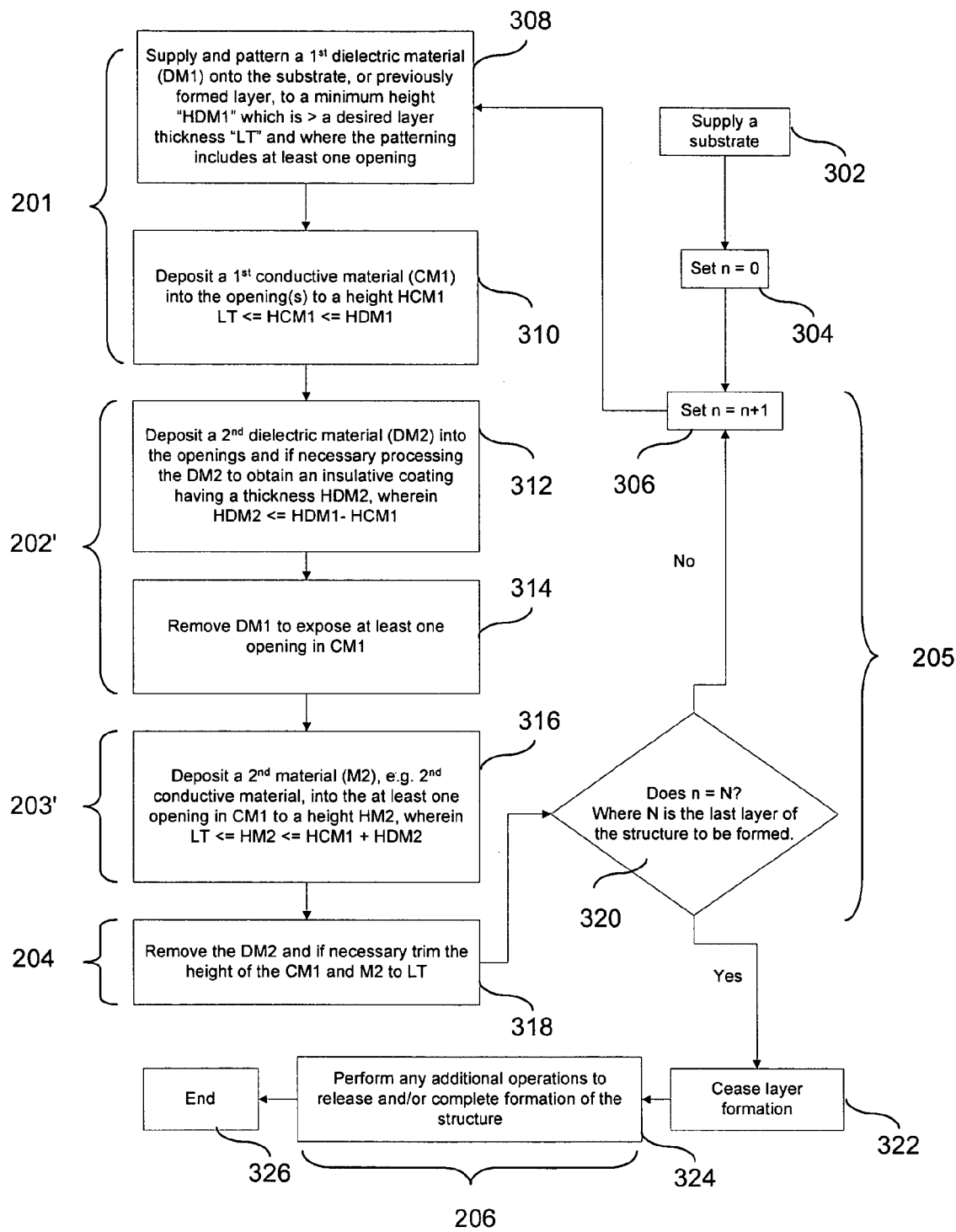
FIG. 6 depicts a flowchart setting forth operations to be followed in forming a three-dimensional structure according to an embodiment of an aspect of the invention wherein a 1$^{st}$ conductive material is over coated with a dielectric material prior to depositing a second material around the sides of the first conductive material.

The process of FIG. 6 begins with element 302 which calls for the supplying of a substrate.

The process then proceeds to element 304 which sets a variable "n" equal to zero. In the process, the variable "n" represents the number of the layer that is currently being formed and will range from 1 to N (with the exception of an initialization value that is set at zero) where N is the layer number associated with the last layer of the structure.

From element 304 the process proceeds to element 306 where the value of "n" is set to "n+1".

The process then moves on to element 308 which calls for the supplying and patterning of a first dielectric material (DM1) onto the substrate. The patterned DM1 will include regions having a deposition height of "HDM1" which is greater than a desired layer thickness (LT) and the patterning will include at least one opening (i.e. aperture or void) that extends from a first (i.e. distal) surface of DM1 through the thickness HDM1 of DM1to the substrate or previously formed layer. In some embodiments, DM1 may be a photoresist material of either the positive or negative type which is applied and then dried and bonded prior to patterning by exposure and development. In other embodiments, DM1 may be an ablatable material that is adhered to the surface of the substrate or previously formed layer. In still other embodiments, DM1 may be supplied in the form of a dry film photoresist having a desired thickness (e.g. supplied in sheet form with or without a protective backing).

From element 308, the process proceeds to element 310 which calls for deposition of a first conductive material (CM1) into the opening or openings in DM1. If necessary, before or after the operation of element 308, a seed layer may be applied if required for the deposition of the first conductive material. If applied after the operation of element 308, the portion of the seed layer not located below the first conductive material may be removed by a planarization operation that may occur between operations 312 and 314, otherwise the seed layer may be removed from the regions to be occupied by a second material by an etching operation that occurs between elements 314 and 316.

The height HCM1 of deposition of CM1 is preferably greater than or equal to LT and is preferably less than or equal to HDM1. In some embodiments the deposition of CM1 may be by electroplating. In other embodiments, CM1 may be supplied by electrophoretic deposition or by some other deposition process that may take advantage of the dielectric shielding that is provided by the masking material which surrounds the perimeter of the region into which CM1 is to be deposited.

Next, the process moves to element 312 which calls for the deposition of a second dielectric material (DM2). The deposition of DM2 preferably occurs in a selective manner which causes DM2 to be located only on the exposed surface of CM1. The thickness HDM2 of DM2 is such that HDM1 minus HCM1 is greater than or equal to HDM2. In some embodiments DM2 may be deposited onto CM1 in a selective manner by electrophoretic deposition. In other embodiments, other selective deposition processes may be used such as, an electrostatic aided deposition processes where particles of the dielectric material are electrostatically held to the first conductive material or are electrostatically preferentially directed to CM1.

The process then moves to element 314 which calls for the removal of the DM1 to create at least one opening through CM1. In element 316 a deposit of a second material (M2) is formed wherein the deposition has preferential selectivity for being deposited into the openings as opposed to onto the surface of the CM1. If necessary a seed layer may be formed prior to the deposition of M2, if such a seed layer is needed. The seed layer may later be removed from selected regions by the removal operation of element 318 or by other operations. The height of deposition HM2 of M2 is preferably less than or equal to the sum of HCM1 and HDM2. The deposition of M2 may occur in a variety of different ways including, for example, via electroplating or electrophoretic deposition. If the deposit is made by electrophoretic deposition and if the deposit is not fully densified, additional operations may be performed to increase the density of M2 or to otherwise seal M2 from significant undesired infiltration during subsequent processing.

Next, the process moves forward to element 318 which calls for the removal of DM2 and if necessary for the trimming of the height of CM1 and/or M2 so that a net height equal to LT is obtained. As noted, above this operation may also be sued to remove any seed layer material that overlaid DM2. The removal of DM2 may occur by a different process than that used for trimming the CM1 and/or M2 or alternatively, both actions may be performed by the same process. For example, planarization via lapping, micro-milling, or fly cutting may be used for both removal of DM2 and for trimming of the height of the CM1 and M2. Alternatively a stripping or etching operation may be used to selectively remove DM2 prior to a lapping or other machining operation being used to trim CM1 and M2. With the operation or operations of element 318 a layer of the structure being formed is completed and the process moves to element 320 which enquires as to whether the just formed layer "n" is the last layer of the structure. If the answer is "no" the process loops back to element 306.

If the answer is "yes" the process moves forward to element 322 which calls for ending layer formation operations. The process then moves to element 324 which calls for the performance of any additional operations necessary to release and or complete the formation of the structure. The structure formed by this process may be a complete or partial structure (e.g. component or device with or without relatively moveable sections). In some embodiments, one of CM1 and M2 is considered a structural material while the other is considered a sacrificial material. If a sacrificial material does exist, an operation performed under this element 324 may include the etching away of the sacrificial material from the structural material. Other operations performed under element 324 may include packaging of the structure, hermetic sealing of the structure, creation of electrical connections to the structure and the like.

From element 324 the process moves to element 326 which calls for the end of processing.

In some alternative embodiments, the process set fourth in elements 308 to 318 may be used only to form a portion of the layers that are used in creating the three-dimensional structure. Various other alternatives to this embodiment will be recognized by those of skill in the art upon reviewing the teachings herein. In some alternative embodiments (e.g. those that involving the use of more than two conductive materials or those that use the dielectric material as part of the layer structure), DM1 may not be completely removed. In some embodiments the height of deposition of CM1 may be greater than that of DM1. In some embodiments the height of deposition of CM2 may be greater than the combined heights of CM1 and DM2.

In some embodiments DM1 is a photoresist material that is patternable by an exposure to selected light or radiation followed by a development operation. The exposure may result in regions with enhanced susceptibility to a developing agent (i.e. positive resist) or enhanced resistivity to such agents (i.e. negative resists). The photoresist may be completely removed by use of a stripping agent or by use of complete exposure and development in the case of positive resists. In some embodiments, DM1 may be patterned more than once or it may be completely removed after a first patterning and development and a second application, exposure, and development may be made to yield a different pattern.

FIGS. 7(a)–7(i) provide exemplary schematic illustrations of side views of various stages involved in the formation of a layer of a three-dimensional structure according to one embodiment that follows the flowchart of FIG. 6.

Figure 7A:
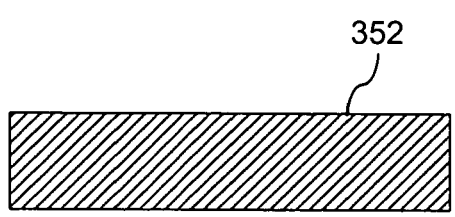
FIGS. 7(a)–7(i) provide exemplary schematic illustrations of side views of various stages involved in the formation of a layer of a three-dimensional structure according to the flowchart of FIG. 6.
Figure 7B:
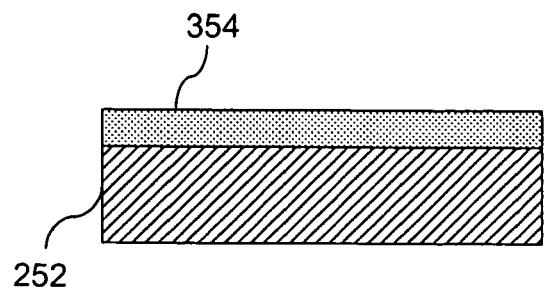
Figure 7C:
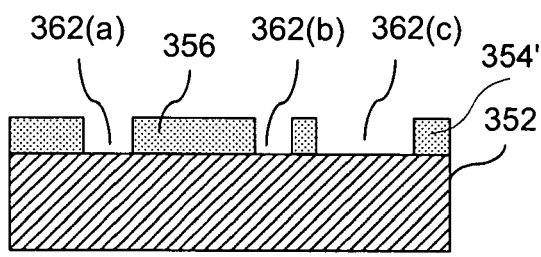
Figure 7D:
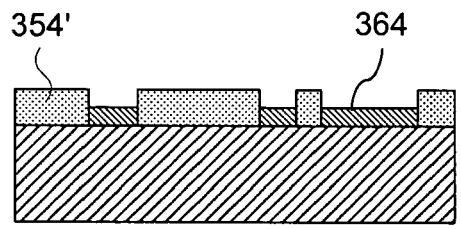
Figure 7E:
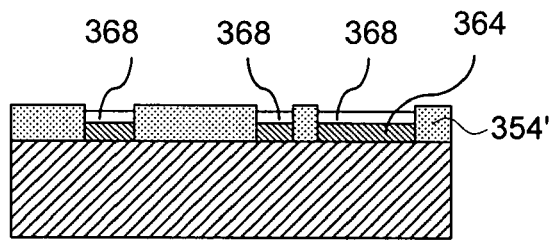

In FIG. 7(a) a substrate 352 is shown, onto which patternable material 354 (e.g., a photoresist) has been deposited as shown in FIG. 7(b). In FIG. 7(c) patternable material 354 has been patterned to yield to produce openings 362(a)–362(c) within a material 354'. If the patternable material is a photoresist, patterning may occur by exposing the material through a photomask and then developing the latent image to produce apertures 362(a)–362(c). In FIG. 7(d), a first conductive material 364 (e.g., a metal such as copper) has been deposited into the openings. The deposition of the first conductive material may occur, for example, by electrodeposition, such as electroplating. In FIG. 7(e), an electrophoretically-depositable material 368 has been electrophoretically deposited within apertures 362(a)–262(c) on the first conductive material 364 to produce an insulating coating 368. The production of the insulating coating may require additional processing to improve consolidation of the material. Such consolidation may be achieved by, for example, applying heat and/or pressure to the deposited material 368 to yield coating 368'. Examples of suitable materials include suspensions of charged insulating polymer particles (e.g., electrodepositable paints and photoresists) and ceramics. Commercial examples, of such treatment materials include electrodepositable photoresists such as Electroimage® Plus manufactured by PPG Industries, and PEPR® 2400 and EAGLE® 2100 ED manufactured by Shipley Ronal. If material 368' is substantially insulating, it will normally be electrodeposited to form a relatively thin substantially continuous (pinhole-free) coating which is uniform in thickness, at which point the insulating nature of the material will prevent further deposition from occurring. Electrophoretically-depositable material 368 should be compatible with the patterned material 354'. The electrodeposition bath used to deposit material 364 and any associated process steps should not significantly degrade material 354'. Moreover, the chemicals used to remove material 354' as well as any involved processes should not significantly degrade material 368'.

Figure 7F:
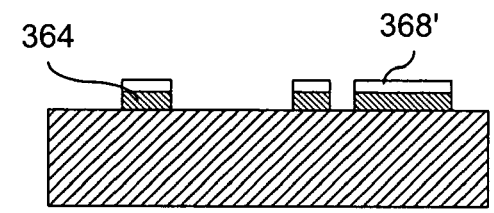
Figure 7G:
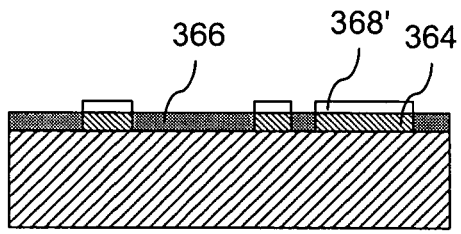

In FIG. 7(f), patternable material 354' has been removed (e.g., by use of a chemical stripper) to expose regions of the substrate 352, or of a previously formed layer, which are not covered with first conductive material 364 or electrophoretically-depositable material 368. In FIG. 7(g), a second material 366 (e.g., a metal such as nickel) has been deposited. Since the upper surface of first conductive material 364 is covered with material 368, no deposition of the second material 366 occurs on this surface, and deposition of material 366 is restricted to regions of substrate 352 which previously had been covered with patternable material 354'. The amount of the second material 366 that is deposited according to this embodiment may be significantly reduced compare to that of material 116 of FIG. 4(f).

Figure 7H:
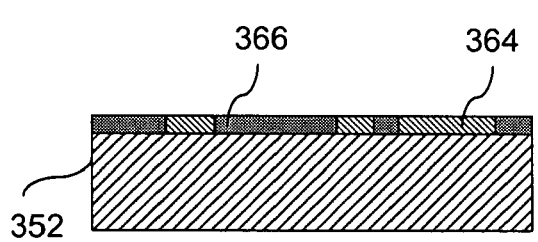
Figure 7I:
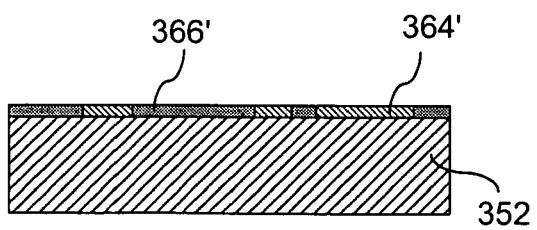

In FIG. 7(h), electrophoretically-deposited material 368 has been removed (e.g., by chemically stripping if material 368 was a photoresist). This step may not be required, since the subsequent planarization step may be sufficient to remove material 368 by use of mechanical or chemical-mechanical action. Finally, in FIG. 7(i) the layer has been planarized to produce trimmed materials 366' and 364'. This planarization process is optional as it may not be required if deposition depths can be precisely enough controlled. The planarization is not necessary to remove material 366 from material 364 but instead may be performed if necessary to establish a layer of the desired thickness, flatness, or surface finish. Such a planarization operation can be performed in less time, and with less use of consumable materials (e.g., slurry, lapping plates, and/or polishing pads) than a planarization operation that must also remove material 366 that is located above material 364.

Figure 8:
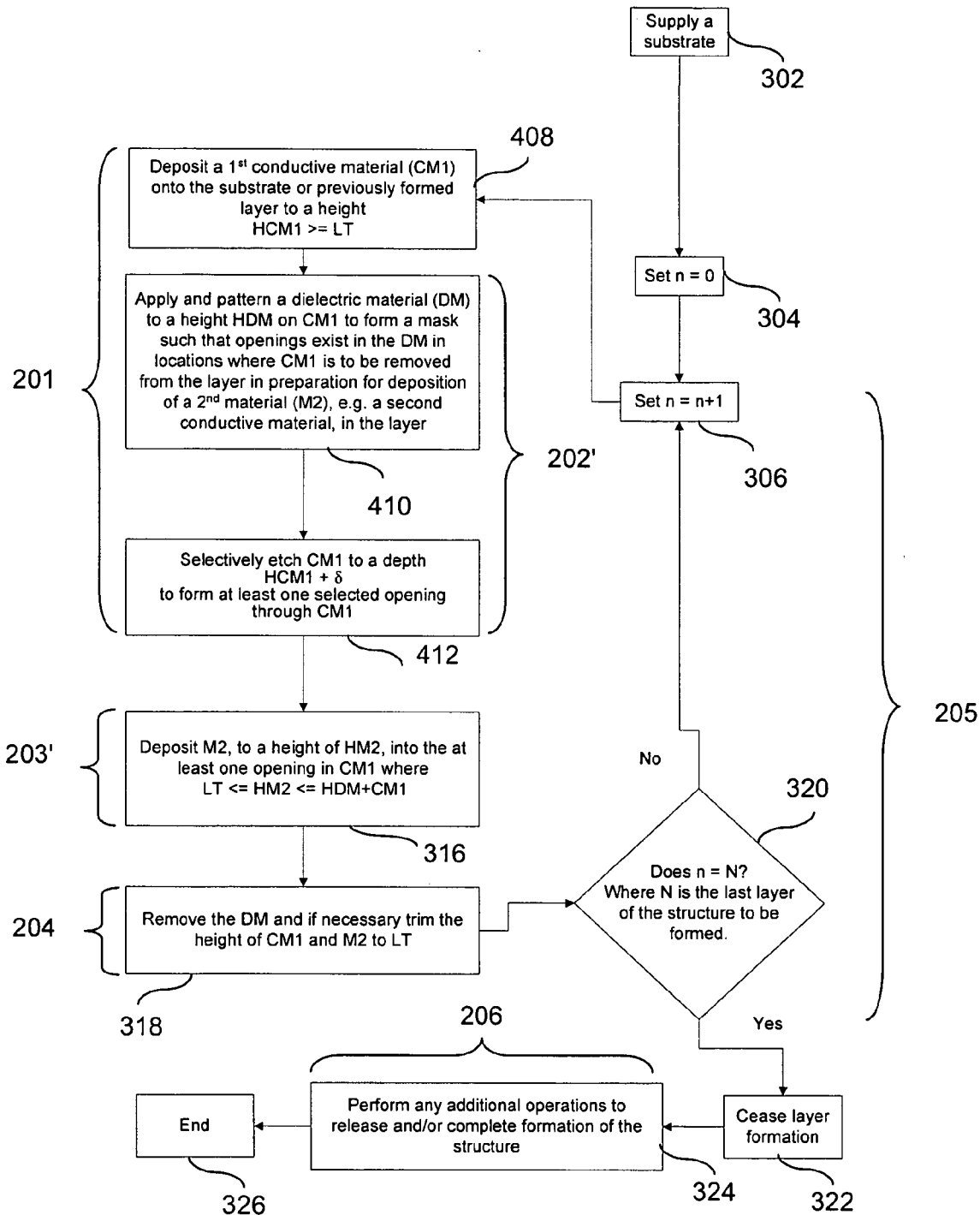
FIG. 8 depicts a flowchart setting forth operations to be followed in forming a three-dimensional structure according to an embodiment of an aspect of the invention wherein a mask is formed over a blanket deposited first conductive material and the first conductive material is selectively etched to form openings for receiving deposition of a second material.
Figure 9A:
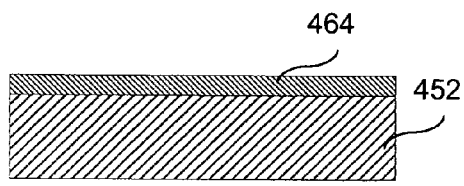
FIGS. 9(a)–9(f) provide exemplary schematic illustrations of side views of various stages involved in the formation of a layer of a three-dimensional structure according to the flowchart of FIG. 8.
Figure 9B:
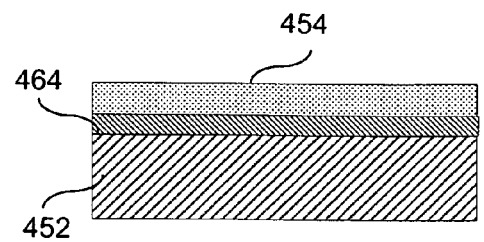
Figure 9C:
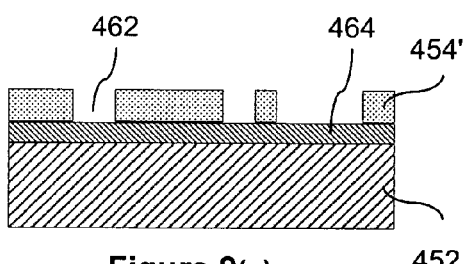
Figure 9D:
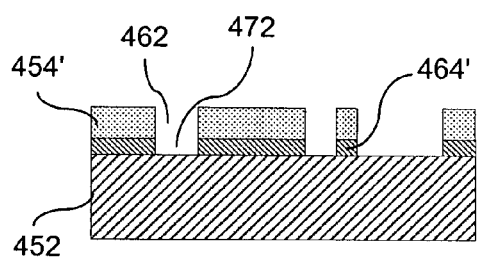
Figure 9E:
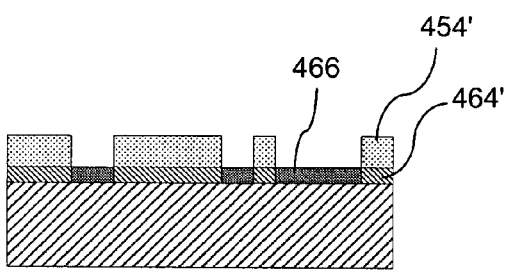
Figure 9F:
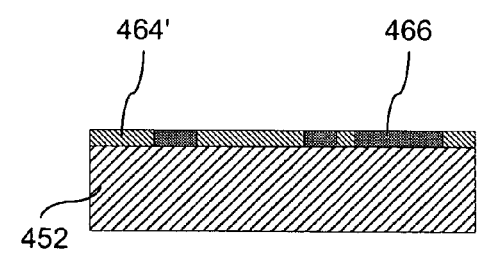

FIG. 8 depicts a flowchart setting forth operations to be followed in forming a three-dimensional structure according to another embodiment wherein a mask is formed over a blanket deposited first conductive material and the first conductive material is selectively etched to form openings for receiving deposition of a second material. The flowchart of FIG. 8 includes a number of elements which are identical to corresponding elements found in the flowchart of FIG. 6. These elements are referenced using identical reference numbers to those set forth in FIG. 6. As these common elements have already been discussed in association with FIG. 6 no detailed description will be provided. The process of FIG. 8 begins with elements 302, 304, and 306 just as did the process of FIG. 6.

After element 306, the process proceeds to element 408 which calls for the deposition of a first conductive material (CM1) onto the substrate or previously formed layer. The height HCM1 of the deposited first conductive material is preferably greater than or equal to a desired layer thickness LT. In some embodiments it may be preferable to use a deposited height slightly greater than layer thickness to allow one or more planarization operations to trim the deposit by small amounts to ensure appropriate exposure of the material to depositions that will occur in association with the deposition of subsequent layers. In other embodiments, such excess thickness may not be required. The deposition called for in element 408 is preferably unpatterned blanket deposition. In some alternative embodiments, inaccuracies in deposition height may make it desirable to planarize the surface of CM1 to give it a desired degree of uniformity and/or to bring the deposition to a desired level. In other embodiments, a thickness of deposition may be detected and used in subsequent operations.

Next, the process moves forward to element 410 which calls for the applying and patterning of a dielectric material onto the surface of the first conductive material. The dielectric material is provided with a height HDM and is patterned so that at least one opening extends from a distal surface of the dielectric material through the height HDM to a surface of the first conductive material. At least one opening is formed in the dielectric material so that the dielectric material may be used as an etching mask for patterning the first conductive material. The first conductive material will be patterned in preparation for depositing a second material (into the openings in the first conductive material that result from the patterning) that will form part of the layers that are built up to form a desired three-dimensional structure. The patterning of the dielectric material is based on the cross sectional pattern or a portion of the cross-sectional pattern of the structure that is being formed that is associated with the current layer (i.e. the nth layer) that is being processed. Data corresponding to the pattern may be derived manually, from a mathematical equation, or by extracting appropriate cross-sectional data from a three-dimensional CAD model of the structure.

Next, the process moves to element 412 which calls for the selective etching of the first conductive material to a depth HCM1+§ (i.e. delta), where § can take on a value ranging from zero up to some desired fraction of a layer thickness. In the most preferred embodiments the depth of etching corresponds substantially to the thickness of the first conductive material HCM1 with possibly a small increment § added thereto, to ensure that the upper surface of the substrate or previously formed layer is reached by the etching operation. In other embodiments, if the first conductive material is a sacrificial material, a very thin film of sacrificial material between layers of a structural material may not be problematic so long as it is thin enough that a post-layer formation etching operation doesn't remove the thin film or otherwise damage the layer-to-layer adhesion of structural material. The etching operation forms at least one opening that extends through the first conductive material. At the end of the process associated with element 412, appropriate openings extend from the surface (e.g. the upper surface assuming right side up staking of layers will occur) of the first conductive material through the thickness HCM1 of the first conductive material in those regions where the first conductive material is not protected by the dielectric material of the mask.

The process then continues on to element 316 which calls for the deposition of a second material (e.g. a second conductive material or a non-conductive material) which deposition will be in effect a selective deposition into the openings through the first conductive material (e.g. as a result of an electroplating or electrophoretic deposition process). The minimum height of deposition of the second material brings the upper surface of the material to a level corresponding to the upper surface of the layer thus the minimum deposition height is LT but it may also require an added increment at least as great as § as this is the depth below the bottom of the layer that the etching of the first conductive material may have produced. As element 316 is similar to that already described with regard to FIG. 6 no further description will be given at this point.

The process continues through elements 318, 320, 322, 324 and 326. As these elements were previously described with regard to FIG. 6, no further description is believed necessary.

In comparing the flow charts of FIG. 6 and FIG. 8 with the operations of FIG. 5(*a*) a distinction between the embodiment of FIG. 6 and the embodiment of FIG. 8 can be seen. In FIG. 6, operation 201 of FIG. 5(*a*) corresponds to element 308 and 310, operation 202' corresponds to elements 312 and 314, operation 203' corresponds to element 316, operation 204 corresponds to element 318 and operation 205 may be considered to correspond to elements 320 and 306 as they cause looping back through elements 308 to 318 so that additional layers may be formed. Finally, operation 206 corresponds to element 324. From these correlations it can be ascertained that each of the operations of FIG. 5(*a*) are performed by distinct elements of FIG. 6.

When making the same operation to element comparison with regard to FIG. 8 it can be seen that operations 203', 204, 205, and 206 correspond to elements that are similar to those associated with FIG. 6. However, in FIG. 8, operation 201 corresponds to a combination of elements 408, 410, and 412, while operation 202' corresponds with elements 410 and 412 which it shares with operation 201. In conclusion the operations of FIG. 5(*a*) are not necessarily completely independent operations, but instead must be considered at least in some embodiments as linked and dependent upon one another.

In some embodiments based on the operations of FIG. 8, the dielectric material comprises a photoresist. In some of those embodiments the photoresist is a positive resist while in some other embodiments the photoresist may be a negative resist. In some embodiments the dielectric may be of the liquid type which requires solidification prior to exposure or it may be of the dry film type. In other embodiments the dielectric may be a photopolymer that is in a liquid state at the time of exposure and which is solidified in response to an exposure. The removal of the dielectric may occur by chemical or mechanical means and if by mechanical means it may be by a lapping operation that may be used to planarize the conductive materials. In some embodiments the conductive materials may be pure metals while in other embodiments they may be alloys (e.g. such as nickel-phosphor, nickel-cobalt, zinc-tin) or composite materials such as filled epoxies. In still other embodiments various features of this embodiment may be replaced by other exemplary elements set forth in FIGS. 5(*b*)–5(*d*), while in still other embodiments features of this embodiment may be replace by or enhanced with other operations that will be apparent to those of skill in the art upon review of the teachings herein.

Though not illustrated in FIG. 8, if dielectric building materials are used, it may also be necessary to use seed layers to allow deposition of one or more of the materials. For example, if the second material is a dielectric or if the substrate is a dielectric, it may be necessary to form a seed layer prior to performing the operation of element 408. The etching operation of element 412 may remove portions of the deposited seed layer. If the second material is a dielectric on only some layers, it may also be necessary to also deposit a second seed layer after performance of operation 412. Appropriate portions of the second seed layer may be removed by the operation of block 318 or they may be removed in other operations.

FIGS. 9(*a*)–9(*f*) provide exemplary schematic illustrations of side views of various stages involved in the formation of a layer of a three-dimensional structure according to one embodiment that follows the flowchart of FIG. 8.

FIG. 9(*a*) shows a first conductive material 464 that has been deposited onto a substrate 452. The deposition of first conductive material 464 may have occurred by a blanket electrodeposition process such as electroplating.

FIG. 9(*b*) depicts an unpatterned dielectric material 454 applied to a surface of the first conductive material 464. In this embodiment dielectric 454 may be a positive or negative photoresist, it may be a photopolymer, or it may be some other dielectric material that is selectively patternable such as for example by an ablation process.

FIG. 9(*c*) depicts the dielectric material 454' after it has been patterned to form openings 462 that extend from a distal surface of the dielectric through the thickness of the dielectric to the first conductive material 464. The pattering process or processes used in the obtainment of the structure of FIG. 9(*c*) may take various forms. If the dielectric material is a photoresist the process may include the production of a photomask, the exposure of the photoresist to appropriate radiation through the photomask, and the subsequent development of the image patterned by the exposure. Alternatively, the patterning may have included a direct write exposure by one or more scanning laser beams followed by development of the photoresist.

FIG. 9(*d*) depicts the partially formed structure after etching of material 464 produces a patterned material 464' which includes openings 472 that extend from a distal surface of the first conductive material through the thickness of the first conductive material to the substrate (or to a previously formed layer if such a layer already existed on the substrate).

FIG. 9(*e*) depicts the partially formed layer of the structure after deposition of a second material 466 results in material 466 being preferentially deposited onto the substrate (or onto a previously formed layer if such a layer already existed on the substrate) through the openings 462 in the dielectric material 454'.

FIG. 9(*f*) depicts the completed layer after removal of dielectric material 454' and potentially after a planarization operation which may have been used, if necessary, to bring the height of the first conductive material and second material to a desired level. Any necessary planarization operation may be accomplished in different ways. For example, planarization may occur by mechanical means such as lapping, fly cutting, or milling or by chemical mechanical processes.

Figure 10:
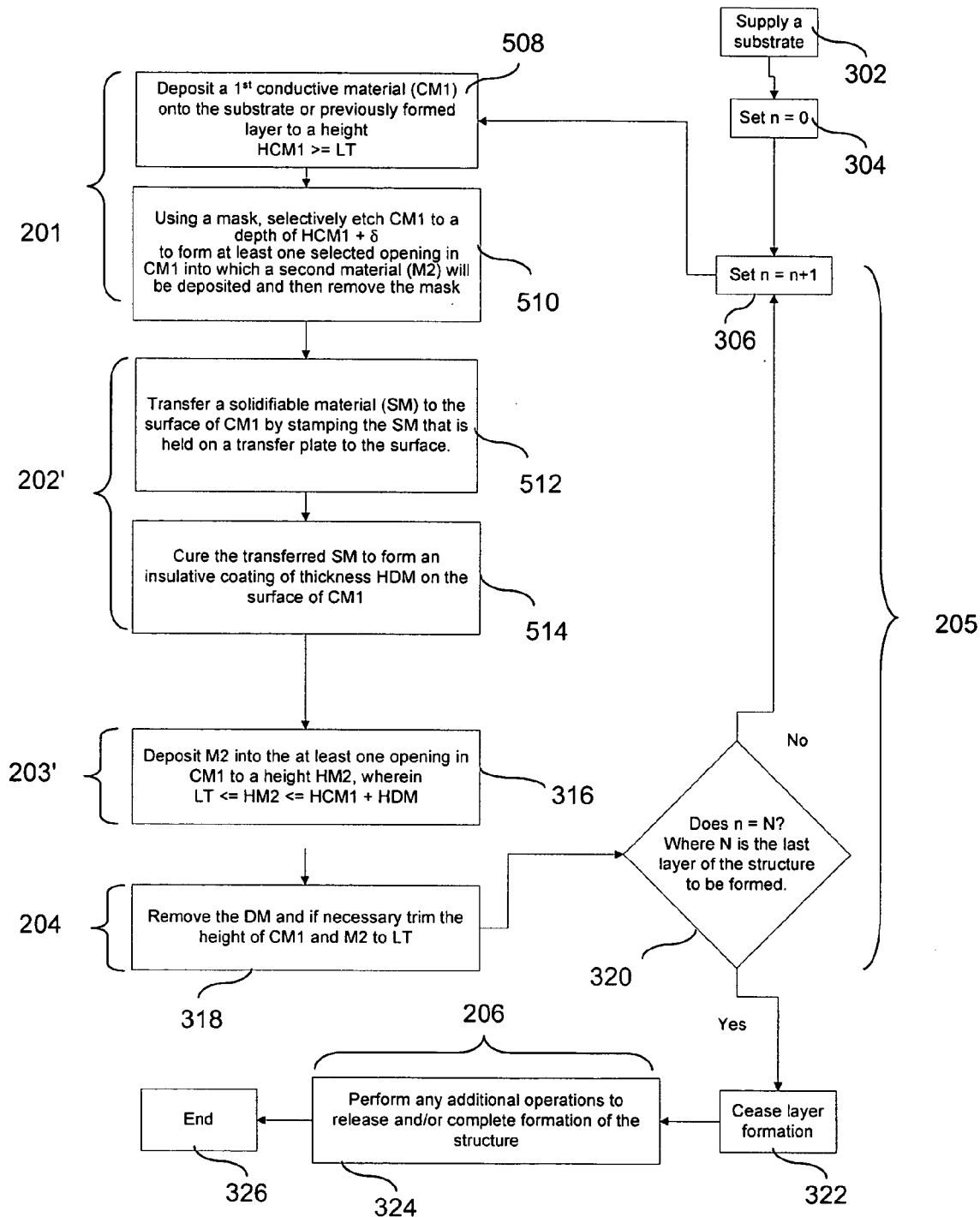
FIG. 10 depicts a flowchart setting forth operations to be followed in forming a three-dimensional structure according to an embodiment of an aspect of the invention wherein a mask is used to selectively etch openings into a first conductive material in preparation for deposition of a second material.

FIG. 10 depicts a flowchart setting forth operations to be followed in forming a three-dimensional structure according to another embodiment wherein a mask (e.g. a conformable contact mask or an adhered mask) is used to selectively etch openings into a first conductive material in preparation for deposition of a second material. FIG. 10 includes a number of elements that are common to both of FIGS. 6 and 8. These common elements include 302, 304, 306, 316, 318, 320, 322, 324 and 326. As these elements has been previously discussed, that discussion will not be repeated at this time but instead the reader is directed back to the discussion of FIG. 6 for a review of these elements. Similarly, previous discussions concerning the application, use, and partial removal of seed layers will also not be repeated here as it is believed that after reviewing the teachings herein, the reviewer will understand how such seed layers may be applied, used, and portions removed.

After element 306 the process proceeds to element 508 which calls for the deposition of a first conductive material (CM1) onto the substrate or previously formed layer. The height of deposition HCM1 is preferably greater than or equal to a desired layer thickness and the deposition is preferably of a blanket type.

Next the process proceeds to element 510 which calls for the use of a mask in selectively etching the first conductive material to a depth that is equal to or slightly greater than HCM1. The use of a slightly larger etching depth is preferred so as to ensure that the substrate or previously formed layer is reached. The etching forms at least one opening through the first conductive material into which a second material (M2) will be deposited. After the etching is completed the mask is removed.

Next the process proceeds to element 512 which calls for the transfer of a solidifiable material (SM) to the distal surface of CM1 by stamping the solidifiable material from a transfer plate to the surface of CM1. The solidifiable material may be in a liquid, powder or paste like state. The solidifiable material may be held on the transfer plate in a patterned or blanket state. In some embodiments electrostatic forces may be used to aid in the transfer of the dielectric material.

Next the process moves forward to step 514 which calls for the curing of the transferred solidifiable material to form an insulated coating on the surface of the first conductive material.

After element 514 the process proceeds to element 316 which, as previously noted, was already discussed in association with FIG. 6.

As with FIGS. 6 and 8, FIG. 10 includes bracketing which illustrates the correspondence between operations and elements. As with FIG. 6 the operations in FIG. 10 are independent of one another as they are not based upon shared elements.

FIGS. 11(a)–11(g) provide schematic illustrations of side views of various stages involved in the formation of a layer of a three-dimensional structure according to one embodiment that follows the flow of the flowchart of FIG. 10. In the example of FIGS. 11 (a)–11(g) the mask used for selective patterning is a conformable contact mask.

Figure 11A:
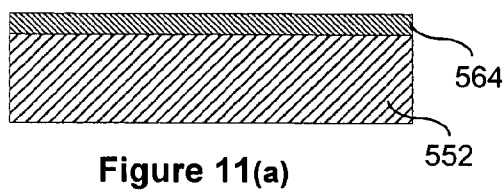
FIGS. 11(a)–11(g) provide schematic illustrations of side views of various stages involved in the formation of a layer of a three-dimensional structure according to the flowchart of FIG. 10 where a conformable contact mask is used for selective patterning.

FIG. 11(a) depicts a deposit of a first conductive material (CM1) 564 located on a substrate 552 (the deposit 564 could instead be located on a surface of a previously formed layer if such a layer already existed on the substrate). The deposition of CM1 is preferably a blanket deposition where the material is electrodeposited. The distal surface of CM1 may be planarized and trimmed so that CM1 has a precisely known thickness if the blanket deposition of CM1 does not yield a sufficiently uniform deposition, predictable deposition height, or the like.

Figure 11B:
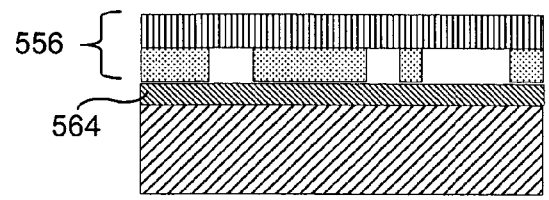

FIG. 11(b) depicts a conformable contact (CC) mask 556 which is pressed against a surface (i.e. the distal surface) of CM1. The CC mask includes a conformable portion which contacts CM1 and a support portion which is separated from CM1. The patterning of the conformable portion of the mask may occur in a variety of different ways, some of which are described in previously discussed U.S. Pat. No. 6,027,630.

Figure 11C:
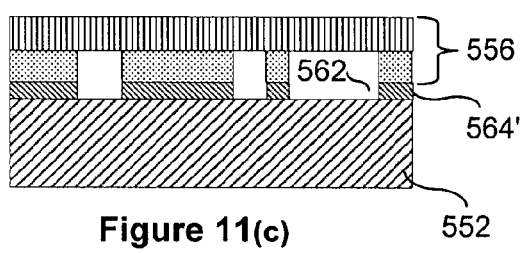

FIG. 11(c) shows the CC mask 566 in contact with the first conductive material 564' after it has been patterned to contain openings 562 that extend from its distal surface through its thickness to the surface of the substrate (the opening would extend to the surface of a previously formed layer if such a layer already existed on substrate 552). The depth of etching may be programmed to be slightly more than the thickness of CM1 to ensure that the surface of the substrate or previously formed layer is reached.

Figure 11D:
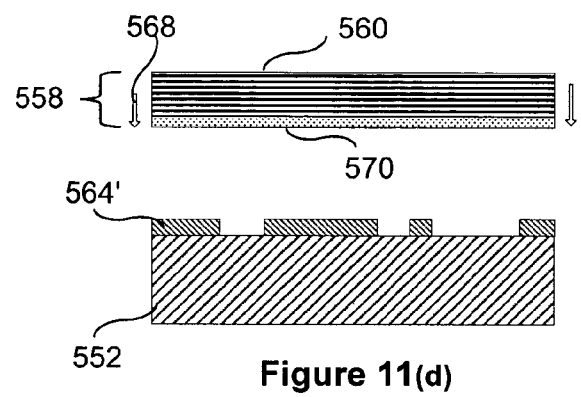

FIG. 11(d) illustrates a transfer plate 558 having a support 560 and a solidifiable material 570 located on a surface thereof. The transfer plate is located above the patterned first conductive material 564' and the arrows 568 indicate that the transfer plate will be stamped against the upper (i.e. distal) surface of CM1. In some alternative embodiments the transfer plate may have a curved shape and the solidifiable material to be transferred to the surface of the first conductive material 564' may be transferred via a roll on and roll off motion.

Figure 11E:
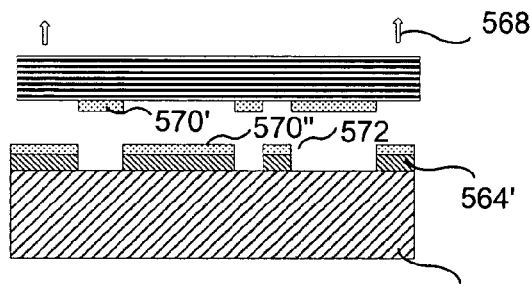

FIG. 11(e) depicts the transfer plate located above the first conductive material after stamping has occurred as indicated by motion arrows 568' show that the transfer plate is moving away from the substrate and CM1. The transferable material 570 is shown in FIG. 11(e) as being separated into two parts 570' which remains adhered to the transfer plate and 570" which has contacted the upper surface of CM1 and remains adhered thereto such that openings 572 exist through the transferred material 570". After transfer of material 570" to the surface of CM1, the transferred material is cured or solidified to form an insulative coating over the surface of the CM1 564'.

Figure 11F:
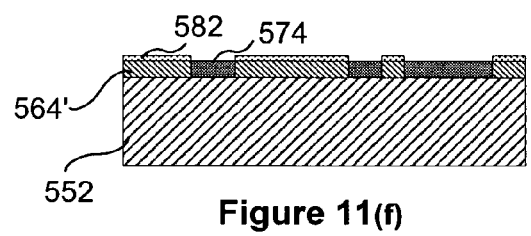

FIG. 11(f) depicts the partially formed structure after removal of the transfer plate and after deposition of a second material (M2) 574 onto the substrate or previously formed layer through the openings 572 in the transferred material and through the openings 562 through CM1. The insulative coating 582 formed from transferred solidifiable material 570" remains located on the upper surface of CM1 during deposition of M2. As a result of the presence of the insulative material, the blanket deposition of the M2 (e.g. via electroplating or electrophoretic deposition) is effectively a selective deposition into the openings 572 and 562.

Figure 11G:
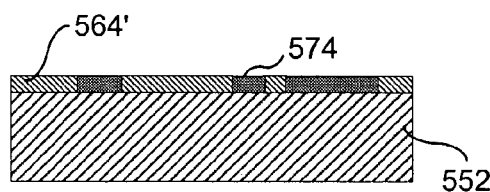

FIG. 11(g) depicts the finalized layer comprising regions of the first conductive material 564' and regions of the second material 574' (which may be identical to material 574 or it may modified such as by filling or trimming away excess material) both located on the surface of a substrate (which could instead be the surface of a previously formed layer if such a layer existed on the substrate). The completed layer is formed by removing the insulated material 582 and by potentially trimming down the upper surface of the second material 574' and possibly the upper surface of the first conductive material 564'. The removal of the insulative material 582 may occur in a separate process from or along with the trimming down of the first conductive material (CM1) and the second material (M2).

Figure 12:
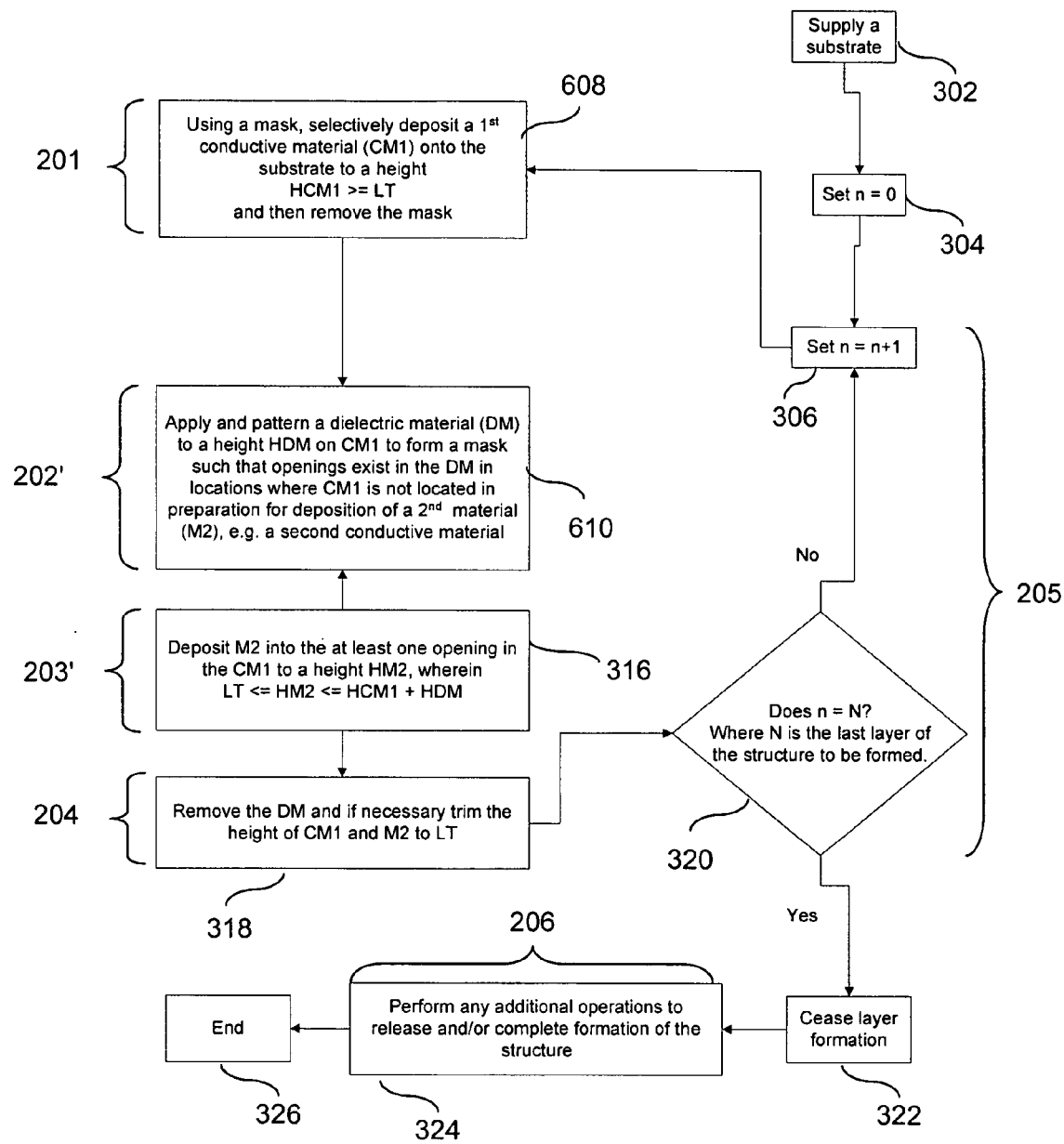
FIG. 12 depicts a flowchart setting forth operations to be followed in forming a three-dimensional structure according to an embodiment of an aspect of the invention wherein a mask is used in the selective deposition of a first conductive material over which a dielectric material is deposited and patterned prior to depositing a second material.

FIG. 12 depicts a flowchart setting forth operations to be followed in forming a three-dimensional structure according to another embodiment wherein a mask (e.g. a conformable contact mask or an adhered mask) is used in the selective deposition of a first conductive material over which a dielectric material is deposited and patterned prior to depositing a second material.

The flowchart of FIG. 12 includes a number of elements that are also found in the flow charts of FIGS. 6, 8, and 10 and are referred to using the same reference numbers as set forth in these earlier figures. These common elements will not be discussed in association with this flowchart as they have already been discussed. These common elements are 302, 304, 306, 316, 318, 320, 322, 324, and 326. For similar reasons further discussion concerning the use of seed layers will be omitted as well.

From element 306 the process proceeds to element 608 which calls for the use of a mask in selectively depositing a first conductive material (CM1) onto a surface of the substrate or previously formed layer. After the deposition is completed the mask is removed.

Next the process proceeds to element 610 which calls for the applying and patterning of a dielectric material (DM) onto the surface of the first conductive material. The patterning of the DM results in openings thru the DM through which a second material (M2) may be deposited onto the substrate. The dielectric may take the form of a flowable photoresist material, the form of a sheet of photoresist material, or it may take some other form. In the case of a photoresist material, patterning may occur by selective exposure through a photomask and then subsequent developing. From element 610 the process proceeds to element 316 which has been discussed with regard to earlier flowcharts and thus will not be discussed herein again FIGS. 13(*a*)–13(*h*) provide schematic illustrations of side views of various stages involved in the formation of a layer of a three-dimensional structure according to the flowchart of FIG. 12 wherein a conformable contact mask is used for selective patterning of a first conductive material.

FIG. 13(*a*) depicts a substrate 652 on which multiple layers will be stacked during the formation of a three-dimensional structure. The substrate 652 may include previously formed layers (not shown).

FIG. 13(*b*) depicts a conformable contact (CC) mask 656 pressed against a surface of the substrate 652 in preparation for performing an electrodeposition operation which will selectively deposit a first conductive material (CM1) through openings in the conformable contact mask.

FIG. 13(*c*) depicts the CC mask 656 still being pressed against the surface of the substrate after electrodeposition of CM1 664 onto the substrate within the openings in the CC mask.

FIG. 13(*d*) illustrates the partially formed first layer after removal of the CC mask showing CM1 664 deposited in a patterned manner on the substrate 652.

From FIG. 13(*d*) the process alternatively proceeds along one of two alternative paths. The process either proceeds through operations illustrated in FIG. 13(*e*)-1 or FIG. 13(*e*)-2 after which the process continues along a common path to FIG. 13(*f*). In FIG. 13(*e*)-1 a coating of a dielectric material 668-1 is formed above and around CM1 whereas FIG. 13(*e*)-2 depicts a sheet of dielectric material 668-2 pressed against the distal surface of CM1.

FIG. 13(*f*) depicts the process after the dielectric material 668 has been patterned to remove portions of dielectric material 668-1 or 668-2 which were not located on the distal surface of CM1. If the dielectric material is a photoresist such patterning may occur by exposure through a photomask and then by development of the resulting latent pattern. In such a case the photoresist may be of either the negative or positive type.

FIG. 13(*g*) shows the partially formed structure after deposition of a second material (M2) 674 through openings in the insulative material 668 and openings in CM1 664.

FIG. 13(*h*) illustrates the structure after completion of the layer which includes the first conductive material 664 and the second material 674. The layer formation is completed by removing the insulative coating 668 from above CM1 and by potentially planarizing or trimming the height of CM1 and/or M2 (if such trimming is necessary).

Figure 14:
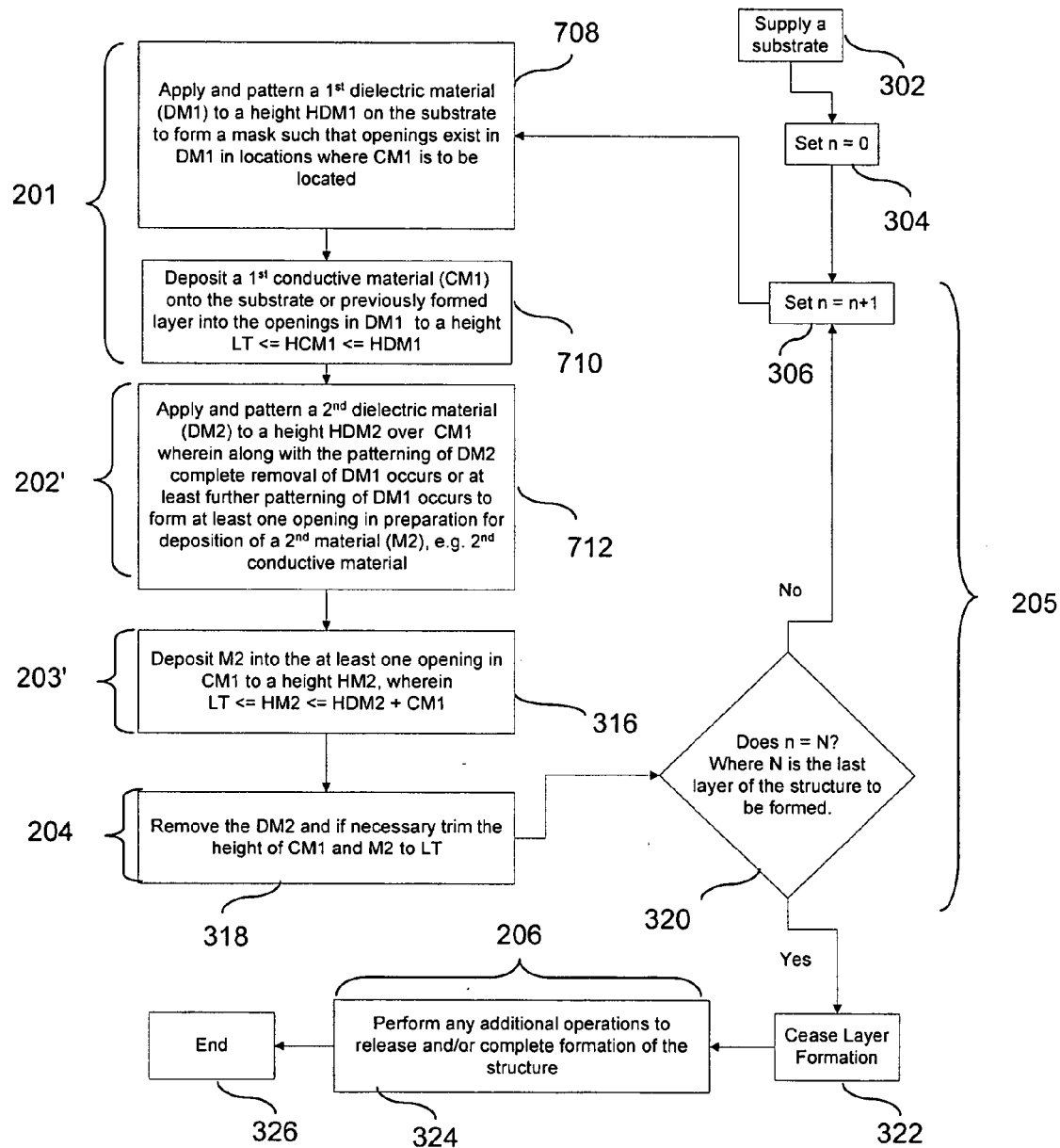
FIG. 14 depicts a flowchart setting forth operations to be followed in forming a three-dimensional structure according to an embodiment of an aspect of the invention wherein a patterned first dielectric is used to control the deposition location of a first conductive material and wherein a second dielectric material is applied and patterned on the first conductive material and where the first dielectric material is removed and a second material deposited.

FIG. 14 depicts a flowchart setting forth operations to be followed in forming a three-dimensional structure according to another embodiment wherein a patterned first dielectric is used to control the deposition location of a first conductive material and wherein a second dielectric material is applied and patterned on the first conductive material and where the first dielectric material is removed and a second material deposited.

The flowchart of FIG. 14 includes a number of elements which are similar to elements included in the flowcharts of FIGS. 6, 8, 10, and 12 and as these elements have already been discussed, they will not be discussed further herein. These common elements have been identified with the same reference numbers. These common elements include 302, 304, 306, 316, 318, 320, 322, 324, and 326. For similar reasons further discussion concerning the use of seed layers will be omitted as well.

After element 306 the process moves forward to element 708 which calls for the application and patterning of a first dielectric material (DM1) on the surface of a substrate. The patterning of DM1 produces openings that extend from a distal surface of DM1 through the thickness of DM1 to the surface of the substrate. The patterning of the dielectric material and the openings will be used in the selective deposition of a first conductive material (CM1) onto the substrate. DM1 may be of a variety of types. For example, it may be a positive or negative photoresist, which may be patterned as discussed herein elsewhere.

Next the process moves forward to element 710 which calls for the deposition of CM1 onto the substrate through the openings in patterned DM1. In some embodiments the deposition of CM1 is an electrodeposition of the electroplating or electrophoretic type. If the deposition is of the electrophoretic type additional processes may be performed to increase the density of the deposition.

Next the process moves forward to element 712 which calls for the application and patterning of a second dielectric material (DM2) over the surface of CM1. Along with the patterning of DM2, DM1 is removed in whole or in part to form openings where a second material (M2) is to be deposited onto the substrate. DM2 may, for example, be a photoresist of the positive and the exposure of DM2 may result in further exposure of DM1 and if DM1 is also a positive photoresist, such exposure may allow not only development and associated removal of portions of DM2 it may also allow development and removal of desired portions of DM1.

After element 712 the process proceeds to element 316 which has been discussed in association with the flowchart of FIG. 6 and will not be discussed further at this time.

FIGS. 15(a)–15(g) provide schematic illustrations of side views of various stages involved in the formation of a layer of a three-dimensional structure according to the flowchart of FIG. 14.

FIG. 15(a) depicts an unpatterned first dielectric (DM1) 754 located on a substrate 752.

FIG. 15(b) depicts the result of patterning the DM1 754 to form 754' which includes openings 762 that extent through DM1 to the substrate.

FIG. 15(c) depicts the partially formed structure after deposition of a first conductive material (CM1) 764 into the openings 762. This deposition may, for example, occur by electroplating.

Figure 13A:
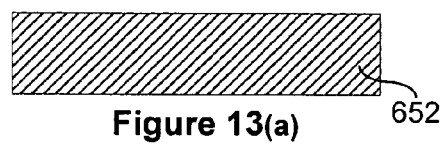
FIGS. 13(a)–13(h) provide schematic illustrations of side views of various stages involved in the formation of a layer of a three-dimensional structure according to the flowchart of FIG. 12 where a conformable contact mask is used for selective patterning.
Figure 13B:
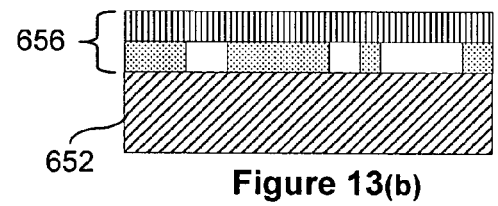
Figure 13C:
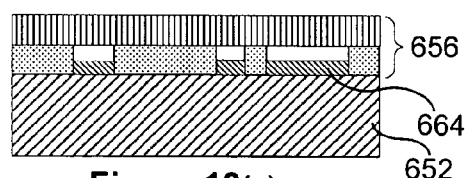
Figure 13D:
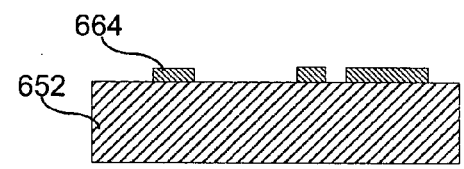
Figures 1, 13E:
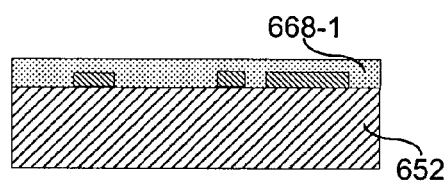

FIG. 15(d) depicts the application of a second dielectric material (DM2) 756 over the surfaces of the CM1 764 as well as the surfaces of the previously patterned dielectric 754'. From FIG. 15(d) the process may proceed along two different paths. One process alternative is depicted in FIG. 15(e)-1 thru FIG. 15(f)-1 and ending with FIG. 15(g). The other process alternative is shown in FIGS. 15(e)-2', 15(e)-2", 15(f)-2, and then ending with FIG. 15(g).

FIG. 15(e)-1 depicts the process after patterning the DM2 756-1 and removal of the DM1 754'. The patterning of DM2 and DM1 may have occurred by the same processing steps, for example, by exposing and developing the two dielectric materials simultaneously (assuming they were both photoresists) or alternatively the patterning of DM2 and the removal of DM1 may have occurred using different process operations. FIG. 15(f)-1 shows the state of the process after depositing a second material (M2) 774 into the openings 772 formed by the patterning of DM2 and the removal of DM1.

The first alternative process ends with the completion of the layer as depicted in FIG. 15(g) wherein completion of the layer occurred by removing remaining portions of the DM2 756-1 and potentially by trimming the heights of depositions associated with CM1 and/or M2.

Figures 2, 13E:
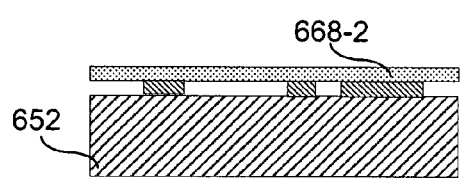
Figure 13F:
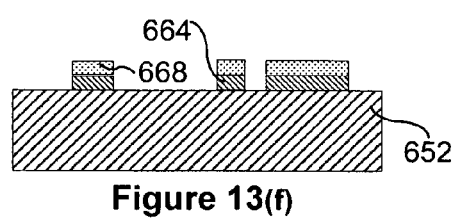
Figure 13G:
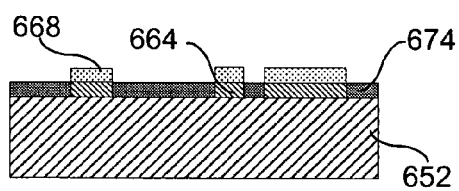
Figure 13H:
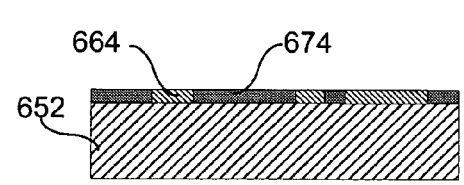

Turing to the second alternative, FIG. 15(e)-2' shows the result of trimming or planarizing the two dielectric materials down to a level that removes the DM2 from being located above the DM1. The resulting pattern of the DM2 is shown by reference number 756-2. In FIG. 15(e)-2' openings are formed by removal of the DM1. This removal of DM1 may occur in a number of different ways, for example, if DM1 was a positive resist and DM2 was a negative resist, a flood exposure of the partially formed structure as illustrated in FIG. 15(e)-2' could result in making the second dielectric material 756-2 resistive to development while making the first dielectric material susceptible to such development. As a second example, the second dielectric material 756-2 may not be of a photoresist type while the first dielectric material is of such a type, in which case the DM2 may not be susceptible to damage by a chemical stripping agent that could be used to remove DM1. FIG. 15(e)-2" shows the state of the process after removal of DM1.

FIG. 15(f)-2 shows the partially formed structure after deposition of a second material (M2) 774 into the openings formed by the removal of DM1.

This second alternative process ends with the completion of the layer as previously described and shown in FIG. 15(g).

Figure 16:
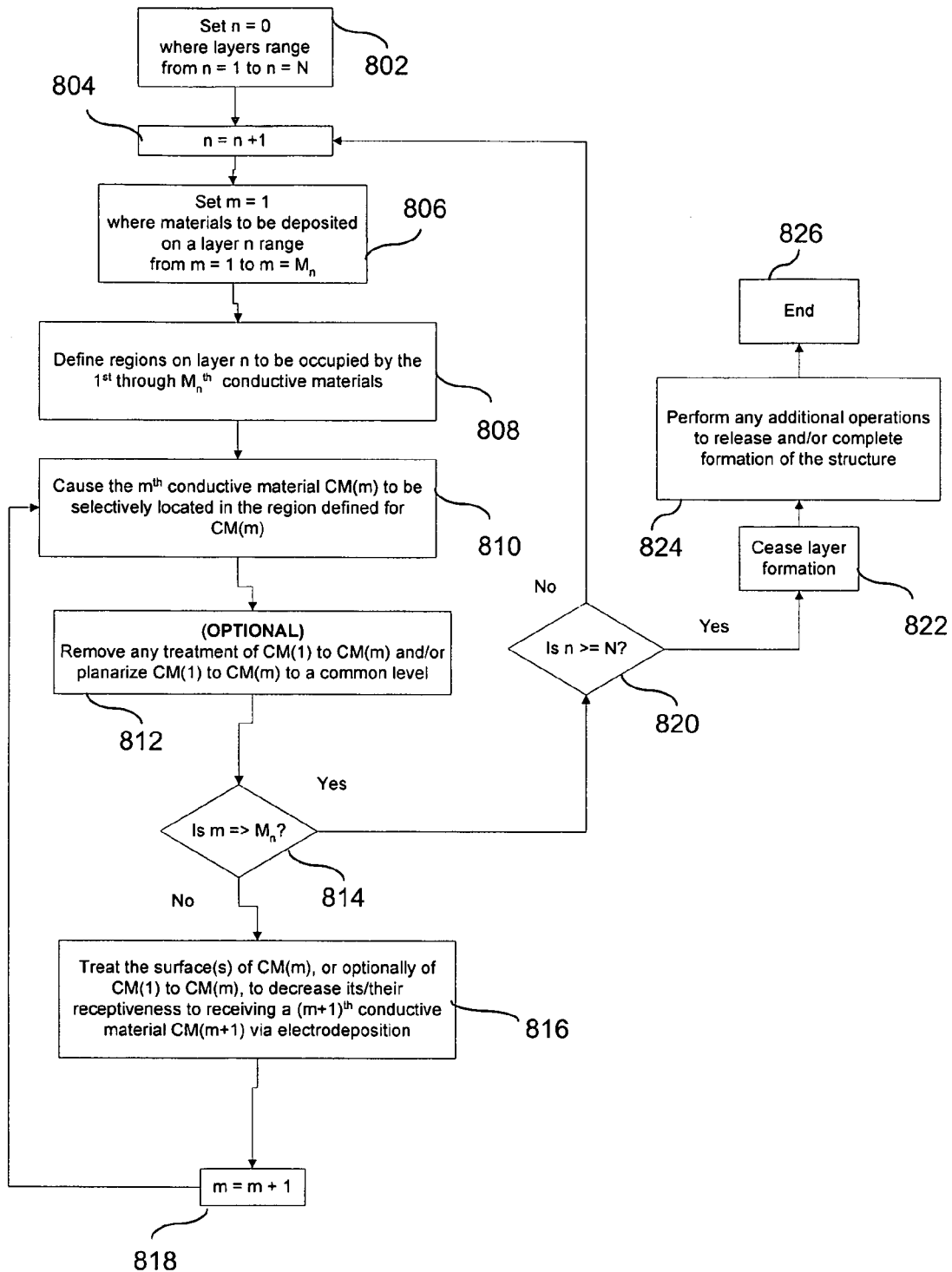
FIG. 16 depicts a flowchart setting forth operations to be followed in forming a three-dimensional structure according to an embodiment of an aspect of the invention wherein the process is generalized to allow the deposition of more than two conductive materials.

FIG. 16 depicts a flowchart setting forth operations to be followed in forming a three-dimensional structure according to another embodiment wherein the process is generalized to allow the deposition of more than two conductive materials.

The process illustrated in FIG. 16 begins with element 802 which calls for the setting of a variable "n" to zero. The variable "n" indicates the layer number that is being formed. Variable "n" ranges from 1 up to N, where N is the number of the last layer to be formed, with the exception of "n" be initialized to a value of "0" momentarily.

The process then proceeds to element 804 where "n" is incremented to a value of "n+1".

Next, the process moves forward to element 806 which sets a variable m to a value of 1. The variable "m" sets the conductive material number which is being deposited and ranges from a value of one up to a value of $M_n$ where $M_n$ is the number of the last conductive material to be deposited for layer "n".

From element 806 the process proceeds to element 808 which calls for the general defining of regions on a layer "n" which are to be occupied by the $1^{st}$ thru $M^{th}$ conductive materials.

Next the process proceeds to element 810 which calls for the $m^{th}$ conductive material to be selectively located in the region defined for it.

Next the process moves forward to the optional element 812 which calls for the removal of any treatment that was applied to a surface of any of the $1^{st}$ through $m^{th}$ conductive materials that have already been deposited. Element 812 also calls for the potential planarization of the already deposited $1^{st}$ thru $m^{th}$ conductive materials. In some alternatives, the treatment removal may be achieved by the planarization operation.

Next the process continues on to element 814 which is a decision branch where an inquiry is made as to whether or not the variable "m" is equal to or greater than $M_n$. If the answer to this inquiry is "no", the process proceeds to element 816 which applies a treatment to the surface of the $m^{th}$ conductive material and/or to the surfaces of the $1^{st}$ through $m^{th}$ conductive materials to decrease its, or their, receptiveness to receiving an $(m+1)^{th}$ conductive material. In this embodiment the deposition of the $(m+1)^{th}$ material occurs via an electrodeposition process. In some alternatives, other deposition processes may be used.

From element 816 the process proceeds to element 818 where the variable "m" is incremented to "m+1" and the process loops back to element 810 where an incremented mth material is deposited.

If the answer to the inquiry of element 814 was "yes", the process proceeds to element 820 where the inquiry is made as to whether the current layer number "n" is greater than or equal to the final layer number N. If the answer to this inquiry is "no", the process loops back to element 804 to begin formation of a next layer. If the answer to this inquiry is "yes", the process proceeds to element 822 which calls for the ceasing of layer formation operations.

The process then moves onward to element 824 which calls for the performance of any additional operations to release and/or complete the formation of the structure.

The process then proceeds to element 826 which calls for the end of the processing.

FIG. 17(a)–17(k) provide schematic illustrations of side views of various stages involved in the formation of a layer of a three-dimensional structure according to the flowchart of FIG. 16 where the number of conductive materials is three.

Figure 17A:
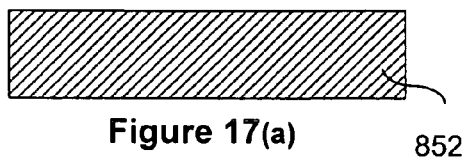
FIGS. 17(a)–17(l) provide schematic illustrations of side views of various stages involved in the formation of a layer of a three-dimensional structure according to the flowchart of FIG. 16.
Figure 17B:
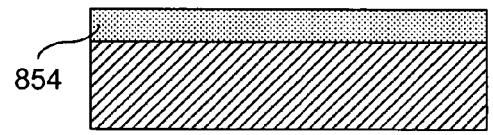
Figure 17C:
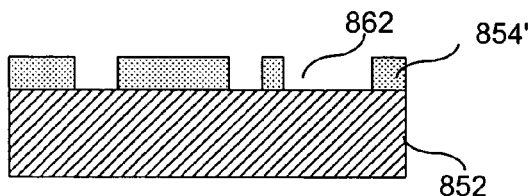
Figure 17D:
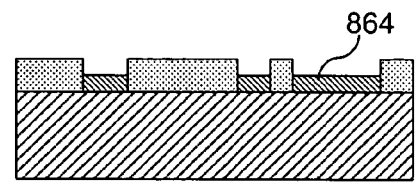

FIG. 17(a) depicts a substrate 852. FIG. 17(b) shows an unpatterned dielectric material 854 located on top of the substrate. FIG. 17(c) shows the patterning of the dielectric material 854 to yield patterned dielectric 854' where openings 862 have been formed through the dielectric in preparation for deposition of a first conductive material (CM1) 864 while FIG. 17(d) shows the process after deposition of CM1.

Figure 17E:
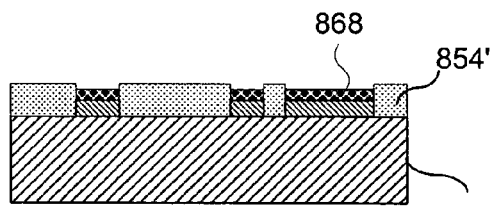

FIG. 17(e) shows the process after treatment of the surface of the CM1 by forming a dielectric coating 868 there on. The dielectric coating may be formed in a number of ways such as, for example, by electrophoretic deposition or by electrostatically aided deposition.

Figure 17F:
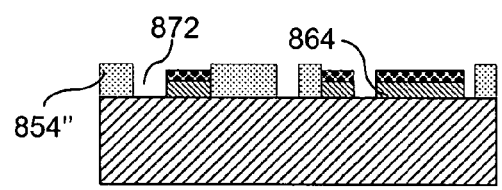
Figure 17G:
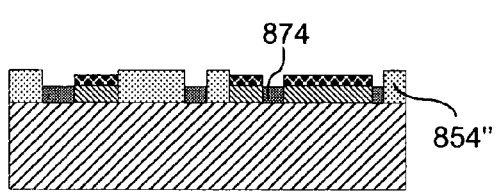

FIG. 17(f) depicts the state of the process after a second patterning of the dielectric material 854 (i.e. a first patterning of material 854') to yield patterned dielectric 854" forms new openings 872 through the dielectric material for subsequent deposition of a second conductive material (CM2) while FIG. 17(g) depicts the process after deposition of a second conductive material 874 into the openings 872.

Figure 17H:
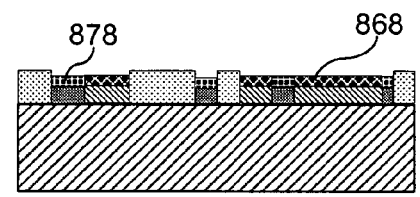

FIG. 17(h) depicts the process after treatment of the surface of the second conductive material by formation of a dielectric coating 878 thereon.

Figure 17I:
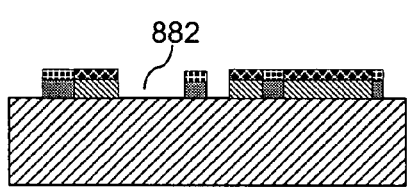
Figure 17J:
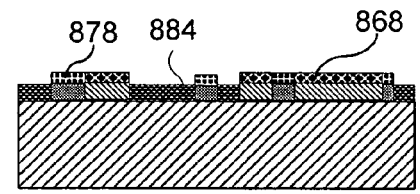

FIG. 17(i) shows the process after a further patterning (i.e. in this case complete removal) of the dielectric material 854" to produce openings 882 thru which a third conductive material (CM3) may be deposited onto the substrate while FIG. 17(j) depicts the process after the deposition of CM3.

Figure 17K:
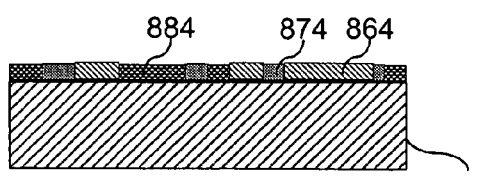
Figure 17L:
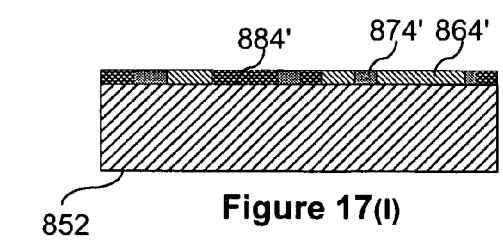

FIG. 17(k) depicts the partially completed layer after removal of the dielectric coating materials 868 and 878. FIG. 17(l) depicts the process after trimming of the conductive materials 864', 874' and 884' to a desired level. In an alternative embodiment the removal of the dielectric materials and the trimming of the conductive materials may have occurred in a single operation.

As noted in block 246 of FIG. 5(d), some embodiments of the invention may not involve the sealing of the surface of the first conductive material with a dielectric material but instead may involve the sealing of the surface of the first conductive material with a very thin coating of a selected conductive material where the selected conductive material has the property or readily develops the property that it will not readily accept coatings of electrodeposited materials.

An example of such a conductive material is chrome (i.e. chromium) which itself may be electrodeposited onto the surface of the first conductive material. Other conductive materials that may not readily accept electroplated or electroless plated deposits may include titanium and tungsten. The deposition of this selected material preferably occurs in a selective manner and more preferably occurs using the same mask that was used to deposit the first conductive material. A sample embodiment of this type may include the following operations:

(1) Locate and selectively pattern a masking material on the surface of a substrate or previously formed layer where openings in the masking material correspond to locations where a first conductive material is to be deposited.

(2) Deposit the first conductive material onto the substrate or previously formed layer via the voids in the masking material. The deposition of a first conductive material, for example, may occur by electroplating.

(3) Prior to removing the masking material, electrodeposit a thin layer of a selected metal which has the property, or readily develops the property, that it will not readily accept coatings of electrodeposited material (e.g. easily becomes passivated) or at minimum has the property or readily develops the property that coatings of electrodeposited material will not adhere well to it. An example of such a conductive material is chrome.

(4) Remove the masking material so as to expose the portions of the substrate or previously formed layer where a second conductive material is to be located.

(5) Deposit a second conductive material onto the surface of the substrate or previously formed layer with the result that no coating or a coating of reduced thickness forms over the first conductive material as a result of the prior deposit of the thin selected material. A reduced coating of material for purposes herein refers to the difference in coating thickness of the second conductive material deposited onto the first conductive material as compared to the coating thickness of the second conductive material deposited onto the substrate or previously formed layer. In particular it is preferred that a reduced coating thickness be no more than about 50% of the coating thickness over the substrate or previously formed layer, more preferably less then about 25% of that thickness, and even more preferably less then about 10% of that thickness. Alternatively worded, preferably the average volume of the coating per unit area over the substrate is more than twice that over the first conductive material, more preferably more than three times, and even more preferably more than about ten times.

(6) After deposition of the second conductive material, the deposited materials are planarized to a level which corresponds to a desired layer thickness. This thickness sets the surface at a level which is below the level which was occupied by the selected material. As such, after the planarization operation is completed, the selected material (i.e. the material that inhibited deposition over the first conductive material) is removed and the just formed layer is capable of accepting electrodepositions at any or all locations on its surface. This allows one or more additional layers of material to be added.

FIGS. 18(a)–18(f) provide schematic illustrations of side views of the states of a process (e.g. the just described process) that may be used in limiting or eliminating the deposition of a second conductive material above deposits of a first conductive material according to an alternative embodiment of the invention wherein a thin layer of a selective conductive material is located above the surface of the first conductive material wherein the selected conductive material is a material that does not readily except electrodepositions of other conductive materials.

Figure 18A:
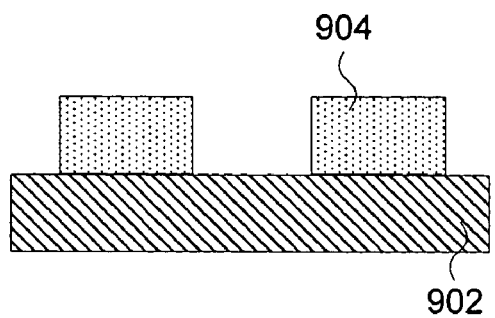
FIGS. 18(a)–18(f) provide schematic illustrations of side views of the states of a process that may be used in limiting or eliminating the deposition of a second conductive material above deposits of a first conductive material according to an alternative embodiment of the invention wherein a thin layer of a selective conductive material is located above the surface of the first conductive material wherein the selected conductive material is a material that does not readily except electrodepositions of other conductive materials.
Figure 18B:
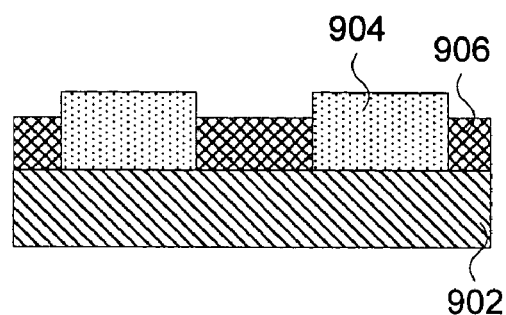

FIG. 18(a) depicts the state of the process after a substrate 902 receives a patterned mask 904. FIG. 18(b) depicts a state of the process after a first conductive material 906 is deposited onto the surface of substrate 902 in those regions unshielded by the material of mask 904.

Figure 18C:
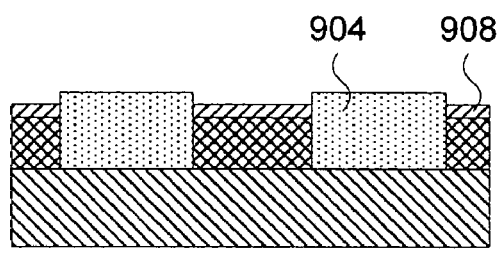

FIG. 18(c) depicts a state of the process after a selected material 908, e.g. chrome, is deposited over the surface of the first conductive material 906.

Figure 18D:
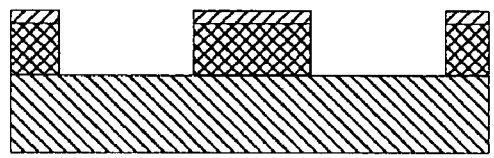
Figure 18:
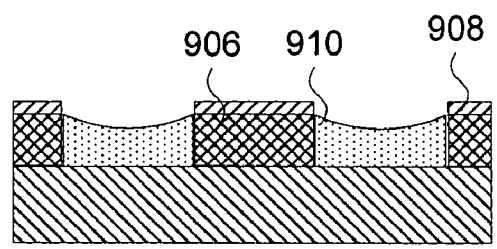

FIG. 18(d) depicts a state of the process after the material of mask 904 is removed and portions of substrate 902 are exposed. The exposed regions of the substrate correspond to locations where a second conductive material is to be deposited.

FIG. 18(e) depicts a state of the process after blanket deposition of a second conductive material 910 occurs with the result that little or no deposition of material 910 occurs over the first conductive material (due to the presence of the selected material) with the possible exception of relatively small regions deposition of material 910 that may mushroom over the edges of selective material 908 as the deposit of material 910 onto the substrate surface and side wall surfaces of the first conductive material occurs.

Figure 18F:
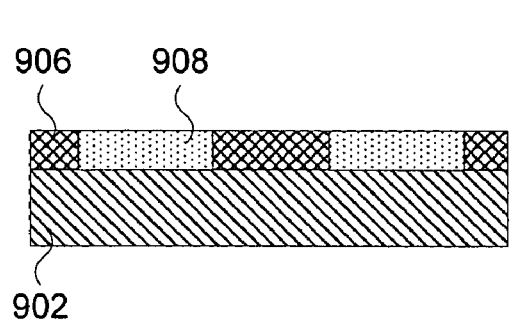

FIG. 18(f) depicts a state of the process after deposited materials 906 and 910 are planarized with overlying material 908 removed.

In various alternative embodiments the features of the various presented embodiments may be combined in different ways. In still other alternative embodiments various features of the examples of FIGS. 5(b)–5(e) may be combined in a variety of ways. In some embodiments the various materials discussed herein need not be single materials but may be multiple materials deposited on top of one another to form single layers from a plurality of varying materials.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, and the like.

Various other embodiments are possible. Some of these embodiments may be based on a combination of the teachings herein with various teachings incorporated herein by reference. Some embodiments may not use a planarization processes on some layers or on any layers. Some embodiments may use nickel as a structural material while other embodiments may use different materials such as gold, silver, copper, zinc, or any other desired materials that can be separated from a copper and/or some other sacrificial material. Some embodiments may remove a sacrificial material while other embodiments may not. In some embodiments, the depth of deposition may be enhanced by pulling a conformable contact mask away from the substrate as deposition is occurring in a manner that allows the seal between the conformable portion of the CC mask and the

| U.S. patent application Ser. No., Filing Date U.S. application Pub. No., Pub Date | Inventor, Title |
|---|---|
| 09/493,496 - Jan. 28, 2000 | Cohen, "Method For Electrochemical Fabrication" |
| 10/677,556 - Oct. 1, 2003 | Cohen, "Monolithic Structures Including Alignment and/or Retention Fixtures for Accepting Components" |
| 10/830,262 - Apr. 21, 2004 | Cohen, "Methods of Reducing Interlayer Discontinuities in Electrochemically Fabricated Three-Dimensional Structures" |
| XX/XXX,XXX - May 7, 2004 (Docket P-US099-A-MF) | Smalley, "Methods for Electrochemically Fabricating Structures Using Adhered Masks, Incorporating Dielectric Sheets, and/or Seed layers That Are Partially Removed Via Planarization" |
| 10/271,574 -Oct. 15, 2002 2003-0127336A - Jul. 10, 2003 | Cohen, "Methods of and Apparatus for Making High Aspect Ratio Microelectromechanical Structures" |
| 10/697,597 - Dec. 20, 2002 | Lockard, "EFAB Methods and Apparatus Including Spray Metal or Powder Coating Processes" |
| 10/677,498 - Oct. 1, 2003 | Cohen, "Multi-cell Masks and Methods and Apparatus for Using Such Masks To Form Three-Dimensional Structures" |
| 10/724,513 - Nov. 26, 2003 | Cohen, "Non-Conformable Masks and Methods and Apparatus for Forming Three-Dimensional Structures" |
| 10/607,931- Jun. 27, 2003 | Brown, "Miniature RF and Microwave Components and Methods for Fabricating Such Components" |
| 10/387,958 - Mar. 13, 2003 2003-022168A - Dec. 4, 2003 | Cohen, "Electrochemical Fabrication Method and Application for Producing Three-Dimensional Structures Having Improved Surface Finish" |
| 10/434,494 - May 7, 2003 2004-0000489A - Jan. 1, 2004 | Zhang, "Methods and Apparatus for Monitoring Deposition Quality During Conformable Contact Mask Plating Operations" |
| 10/434,289 - May 7, 2003 20040065555A - Apr. 8, 2004 | Zhang, "Conformable Contact Masking Methods and Apparatus Utilizing In Situ Cathodic Activation of a Substrate" |
| 10/434,294 - May 7, 2003 2004-0065550A - Apr. 8, 2004 | Zhang, "Electrochemical Fabrication Methods With Enhanced Post Deposition Processing Enhanced Post Deposition Processing" |
| 10/434,295 - May 7, 2003 2004-0004001A - Jan. 8, 2004 | Cohen, "Method of and Apparatus for Forming Three-Dimensional Structures Integral With Semiconductor Based Circuitry" |
| 10/434,315 - May 7, 2003 2003-0234179A - Dec. 25, 2003 | Bang, "Methods of and Apparatus for Molding Structures Using Sacrificial Metal Patterns" |
| 10/434,103 - May 7, 2004 2004-0020782A - Feb. 5, 2004 | Cohen, "Electrochemically Fabricated Hermetically Sealed Microstructures and Methods of and Apparatus for Producing Such Structures" |
| XX/XXX,XXX - May 7, 2004 (Docket P-US104-A-MF) | Thompson, "Electrochemically Fabricated Structures Having Dielectric or Active Bases and Methods of and Apparatus for Producing Such Structures" |
| 10/434,519 - May 7, 2003 2004-0007470A - Jan. 15, 2004 | Smalley, "Methods of and Apparatus for Electrochemically Fabricating Structures Via Interlaced Layers or Via Selective Etching and Filling of Voids" |
| 10/724,515 - Nov. 26, 2003 | Cohen, "Method for Electrochemically Forming Structures Including Non-Parallel Mating of Contact Masks and Substrates" |
| XX/XXX,XXX - May 7, 2004 (Docket P-US105-A-MF) | Cohen, "Multi-step Release Method for Electrochemically Fabricated Structures" | substrate to shift from the face of the conformal material to the inside edges of the conformable material.

In view of the teachings herein, many further embodiments, alternatives in design and uses are possible and will be apparent to those of skill in the art. As such, it is not intended that the invention be limited to the particular illustrative embodiments, alternatives, and uses described above but instead that it be solely limited by the claims presented hereafter.

We claim:

1. A method for forming at least a portion of a three-dimensional structure from a plurality of stacked and adhered layers, comprising:
   (a) depositing and patterning a first conductive material on a substrate or previous layer to obtain a desired pattern having at least one protrusion of the first conductive material having a surface and at least one opening extending from the surface through a thickness of the first conductive material to the substrate or previously formed layer;
   (b) treating the surface of the first conductive material to decrease susceptibility of the surface to receive a second conductive material which is to be deposited;
   (c) depositing the second conductive material, such that deposition occurs with a higher selectivity to one or more regions defined by the at least one opening, wherein the higher selectivity results, at least in part, from the treating of the surface of the first conductive material;
   (d) removing an effect of the treating of the surface of the first conductive material;
   (e) repeating elements (a)–(d) such that a plurality of stacked layers are adhered to successively formed layers to form the at least portion of the three-dimensional structure.

2. The method of claim 1 wherein the depositing and patterning of the first conductive material comprises electroplating the first conductive material onto the substrate or previously formed layer using a contact mask.

3. The method of claim 1 wherein the depositing and patterning of the first conductive material comprises electroplating the first conductive material onto the substrate or previously formed layer using a patterned dielectric adhered to the substrate or previously formed layer.

4. The method of claim 1 wherein the depositing and patterning of the first conductive material comprises blanket depositing the first conductive material onto the substrate or previously formed layer and then patterning the deposited first conductive material.

5. The method of claim 4 wherein the patterning of the first conductive material comprises selectively etching the first conductive material wherein selectivity of the etching is obtained using a contact mask.

6. The method of claim 4 wherein the patterning of the first conductive material comprises selectively etching the first conductive material wherein selectivity of the etching is obtained using a patterned dielectric adhered to the substrate or previously formed layer.

7. The method of claim 6 wherein the etching comprises wet etching.

8. The method of claim 7 wherein the etching comprises chemical etching.

9. The method of claim 7 wherein the etching comprises electrochemical etching.

10. The method of claim 6 wherein the etching comprises dry etching.

11. The method of claim 6 wherein the etching comprises at least one of reactive ion etching, sputter etching, or vapor phase etching.

12. The method of claim 4 wherein the patterning of the first conductive material comprises ablating selected portions of the first conductive material.

13. The method of claim 1 wherein the treating of the surface comprises stamping a solidifiable material against the surface to transfer the material to the surface and then solidifying the solidifiable material on the surface to form a dielectric coating.

14. The method of claim 1 wherein the treating of the surface comprises applying at least one of a solidifiable material or powder material to the surface using a roller to transfer the solidifiable material and then solidifying and adhering the transferred solidifiable material on the surface to form a dielectric coating.

15. The method of claim 1 wherein the treating of the surface comprises:
   (a) applying and adhering a sheet of photoresist to the surface of the first conductive material;
   (b) patterning the photoresist to leave at least one opening through the photoresist in at least one location where the second conductive material is to be deposited.

16. The method of claim 1 wherein the treating of the surface comprises:
   (a) applying a coating of photoresist to the surface of the first conductive material;
   (b) solidifying, patterning, and adhering the photoresist to leave at least one opening through the photoresist in at least one location were the second conductive material is to be deposited.

17. The method of claim 1 wherein the treating of the surface comprises:
   (a) applying a sheet of dielectric material to the surface of the first conductive material;
   (b) bonding the sheet of dielectric material to the surface; and
   (c) applying at least one of gas pressure, liquid conveyed pressure or particulate conveyed pressure to the sheet to cause separation between those portions of the sheet supported by the first conductive material and those portions that are not supported.

18. The method of claim 1 wherein the treating of the surface comprises:
   (a) applying a solidifiable material, supported by a support structure, to the first conductive material;
   (b) solidifying solidifiable material on the first conductive material to form a dielectric coating; and
   (c) lifting off or peeling back the support structure to leave the surface of the first conductive material covered by the dielectric coating whereby portions of the coating not in contact with the first conductive material remain adhered to the support structure during lifting off or peeling back.

19. The method of claim 1 wherein the treating of the surface comprises:
   (a) adhering a patterned dielectric material to the surface of the first conductive material, wherein the patterned dielectric is supported by a support structure; and
   (b) separating the support structure from the patterned dielectric.

20. The method of claim 1 wherein the treating of the surface comprises:
   (a) applying a solidifiable material to the surface of the first conductive material and to the substrate or previously formed layer exposed by the at least one opening;

(b) solidifying the solidifiable material to form a first solidified material; and (c) planarizing the solidified material to expose the first conductive material;

(d) selectively depositing a second solidifiable material onto the exposed first conductive material and then solidifying the second solidifiable material to form a second solidified material; and (e) removing the first solidified material to expose the substrate or previously formed layer through the at least one opening in the first conductive material.

21. The method of claim 1 wherein the treating of the surface comprises applying a selected conductive material to the exposed surface of the first conductive material, wherein the selective conductive material has the property that is does not readily accept at least one of electrodeposits or electroless deposits of at least some other conductive materials.

22. The method of claim 21 wherein the selected conductive material comprises chromium.

23. The method of claim 1 wherein the treating of the surface comprises a chemical treatment of the surface that converts the surface to a dielectric material.

24. The method of claim 23 wherein the chemical treatment oxidizes the exposed surface of the first conductive material.

25. The method of claim 1 wherein the patterning of the first conductive material comprises:

(a) contacting or adhering a mask to the substrate or previously formed layer, wherein the mask has at least one opening through which the first conductive material may be deposited onto the substrate or previously formed layer; and (b) electrodepositing the first conductive material onto the substrate or previously formed layer through the at least one opening.

26. The method of claim 25, wherein a height of the at least one opening through the mask is greater than a thickness of deposit of the first conductive material, such that at least a portion of the opening remains unfilled by the first conductive material, and wherein the treating of the surface of the first conductive material, comprises:

(a) electrophoretically depositing a dielectric material into the unfilled portion of the at least one opening.

27. The method of claim 26, additionally comprising:

(a) treating the electrophoretically deposited dielectric material to transform the electrophoretically deposited material into at least one cohesive insulative coating.

28. The method of claim 27 wherein the treating of the electrophoretically deposited dielectric material comprises at least one of:

(a) applying pressure to the electrophoretically deposited dielectric material;

(b) heating the electrophoretically deposited dielectric material; or (c) applying a selected radiation to the electrophoretically deposited dielectric material.

29. The method of claim 25, wherein a height of the at least one opening through the mask is greater than a thickness of deposit of the first conductive material, such that at least a portion of the opening remains unfilled by the first conductive material, and wherein the treating of the surface of the first conductive material, comprises spraying or spreading a material into the unfilled portion of the at least one opening.

30. The method of claim 29, additionally comprising treating the sprayed or spread material to form at least one cohesive insulative coating within the at least one opening.

31. The method of claim 30 wherein the treating of the sprayed or spread dielectric material comprises at least one of:

(a) applying pressure to the sprayed or spread material;
(b) heating the sprayed or spread material;
(c) applying a selected radiation to the sprayed or spread material; or
(d) removing oxygen from the sprayed or spread material.

32. The method of claim 25, wherein a height of the at least one opening through the mask is greater than a thickness of deposit of the first conductive material, such that at least a portion of the opening remains unfilled by the first conductive material, and wherein the treating of the surface of the first conductive material, comprises electrostatically directing a powdered dielectric material to a desired location, or away from a desired location, using repulsive or attractive force or causing adhesion between a powdered dielectric and the first conductive material located in an unfilled portion of the at least one opening.

33. The method of claim 32, additionally comprising removing powdered dielectric material from undesired locations using at least one of gravity, a magnetic brush, or gas flow.

34. The method of claim 32, additionally comprising treating the powdered dielectric material to form at least one cohesive insulative coating within the at least one opening.

35. The method of claim 34 wherein the treating of the powdered dielectric material comprises at least one of:

(a) applying pressure to powdered dielectric material;
(b) heating the powdered dielectric material; or
(c) applying a selected radiation to the powdered dielectric.

36. The method of claim 25 wherein mask is a first mask and wherein the treating of the surface of the first conductive material comprises:

(a) applying a coating of solidifiable dielectric material on the first mask and on the surface of the first conductive material; and (b) solidifying at least a portion of the solidifiable dielectric material to form at least a partial insulative coating; and (c) etching away those portions of the coating of solidifiable dielectric material or of the insulative coating that do not overlay the first conductive material.

37. The method of claim 25 wherein mask is a first mask and wherein the treating of the surface of the first conductive material comprises:

(a) applying a sheet or coating of photoresist on the first mask and on the surface of the first conductive material; and (b) patterning the photoresist to form an insulative coating on the first conductive material.

38. The method of claim 1 wherein formation of a layer comprises deposition of at least one additional conductive material.

39. The method of claim 38 wherein a surface of the second conductive material, or of one of the at least one additional conductive materials, is treated to decrease susceptibility of the surface of the second conductive material, or of one of the at least one additional conductive materials, to receive a deposition of a subsequently deposited conductive material.

40. The method of claim 39 wherein the treatment of the second conductive material, or of one of the at least one additional conductive materials, treats a surface of the first conductive material to decrease susceptibility of the surface of the first conductive material to receive a deposition of the subsequently deposited conductive material.

41. The method of claim 39 wherein the treatment of the second conductive material, or of one of the at least one additional conductive materials, is removed separately form the removal of the treatment of the first conductive material.

42. The method of claim 39 wherein the treatment of the second conductive material, or of one of the at least one additional conductive materials, is removed along with the removal of the treatment of the first conductive material.

43. The method of claim 1 additional comprising:
(a) planarizing the first conductive material and the second conductive material to a common level during the formation of at least some layers.

44. The method of claim 1 wherein one of the first or second conductive materials is a structural material while the other of the first or second conductive materials is a sacrificial material, and wherein the method additional comprises separating the sacrificial material from the structural material to release the at least portion of the three-dimensional structure.

45. The method of claim 1 wherein the first conductive material comprises a plurality of materials one deposited on another.

46. The method of claim 1 wherein the first conductive material comprises a material on one layer and a different material on a different layer.

47. The method of claim 1 wherein the second conductive material comprises a plurality of materials one deposited on another.

48. The method of claim 1 wherein the second conductive material comprises a material on one layer and a different material on a different layer.

49. A method for forming at least a portion of a three-dimensional structure from a plurality of stacked and adhered layers, comprising:
(a) depositing and patterning a first conductive material on a substrate or previous layer to obtain a desired pattern having at least one protrusion of the first conductive material having a surface and at least one opening extending from the surface through a thickness of the first conductive material to the substrate or previously formed layer;
(b) treating the surface of the first conductive material to form a coating on the first conductive material;
(c) depositing the second conductive material at least into the at least one opening;
(d) removing the coating from the surface of the first conductive material along with any second conductive material deposited thereon;
(e) repeating elements (a)–(d) such that a plurality of stacked layers are adhered to successively formed layers to form the at least portion of the three-dimensional structure.

50. The method of claim 49 wherein formation of a layer comprises deposition of at least one additional conductive material.

51. The method of claim 50 wherein a surface of the second conductive material, or of one of the at least one additional conductive materials, is treated to decrease susceptibility of the surface of the second conductive material, or of the at least one additional conductive materials, to receive a deposition of a subsequently deposited conductive material.

52. The method of claim 51 wherein the treatment of the second conductive material, or of one of the at least one additional conductive materials, treats a surface of the first conductive material to decrease susceptibility of the surface of the first conductive material to receive a deposition of the subsequently deposited conductive material.

53. The method of claim 51 wherein the treatment of the second conductive material or of one of the at least one additional conductive materials is removed separately form the removal of the treatment of the first conductive material.

54. The method of claim 51 wherein the treatment of the second conductive material, or of one of the at least one additional conductive materials, is removed along with the removal of the treatment of the first conductive material.

55. The method of claim 49 additional comprising planarizing the first conductive material and the second conductive material to a common level during the formation of at least some layers.

56. The method of claim 49 wherein one of the first or second conductive materials is a structural material while the other of the first or second conductive materials is a sacrificial material, and wherein the method additional additionally comprises separating the sacrificial material from the structural material to release the at least portion of the three-dimensional structure.

57. A method for forming at least a portion of a three-dimensional structure from a plurality of stacked and adhered layers, comprising:
(a) depositing and patterning a first conductive material on a substrate or previous layer to obtain a desired pattern having at least one protrusion of the first conductive material having a surface and at least one opening extending from the surface through a thickness of the first conductive material to the substrate or previously formed layer;
(b) forming a dielectric coating on the surface of the first conductive material to decrease susceptibility of the surface to receive a second conductive material which is to be deposited;
(c) depositing the second conductive material, such that deposition occurs with a higher selectivity to one or more regions defined by the at least one opening, wherein the higher selectivity results, at least in part, from the treating of the surface of the first conductive material;
(d) removing an effect of the treating of the surface of the first conductive material;
(e) repeating elements (a)–(d) such that a plurality of stacked layers are adhered to successively formed layers to form the at least portion of the three-dimensional structure.

58. The method of claim 57 additional comprising planarizing the first conductive material and the second conductive material to a common level during the formation of at least some layers.

59. The method of claim 57 wherein one of the first or second conductive materials is a structural material while the other of the first or second conductive materials is a sacrificial material, and wherein the method additionally comprises separating the sacrificial material from the structural material to release the at least portion of the three-dimensional structure.

60. A method for forming at least a portion of a three-dimensional structure from a plurality of stacked and adhered layers, comprising:
(a) depositing and patterning a first conductive material on a substrate or previous layer to obtain a desired pattern having at least one protrusion of the first conductive material having a surface and at least one opening extending from the surface through a thickness of the first conductive material to the substrate or previously formed layer;

(b) treating the surface of the first conductive material to decrease susceptibility of the surface to receive a second material which is to be deposited;

(c) depositing the second material, such that deposition occurs with a higher selectivity to one or more regions defined by the at least one opening, wherein the higher selectivity results, at least in part, from the treating of the surface of the first conductive material;

(d) removing an effect of the treating of the surface of the first conductive material;

(e) repeating elements (a)–(d) such that a plurality of stacked layers are adhered to successively formed layers to form the at least portion of the three-dimensional structure.

61. The method of claim 60 wherein the first conductive material comprises a plurality of materials one deposited on another.

62. The method of claim 60 wherein the first conductive material comprises a material on one layer and a different material on a different layer.

63. The method of claim 60 wherein the second material comprises a plurality of materials one deposited on another.

64. The method of claim 60 wherein the second material comprises a material on one layer and a different material on a different layer.

65. A method for forming at least a portion of a three-dimensional structure from a plurality of stacked and adhered layers, comprising:

(a) depositing and patterning a first conductive material on a substrate or previous layer to obtain a desired pattern having at least one protrusion of the first conductive material having a surface and at least one opening extending from the surface through a thickness of the first conductive material to the substrate or previously formed layer;

(b) treating the surface of the first conductive material to form a coating on the first conductive material;

(c) depositing the second material at least into the at least one opening;

(d) removing the coating from the surface of the first conductive material along with any second material deposited thereon;

(e) repeating elements (a)–(d) such that a plurality of stacked layers are adhered to successively formed layers to form the at least portion of the three-dimensional structure.

66. The method of claim 65 wherein the first conductive material comprises a plurality of materials one deposited on another.

67. The method of claim 65 wherein the first conductive material comprises a material on one layer and a different material on a different layer.

68. The method of claim 65 wherein the second material comprises a plurality of materials one deposited on another.

69. The method of claim 65 wherein the second material comprises a material on one layer and a different material on a different layer.

* * * * *